United States Patent
Imada

(10) Patent No.: US 8,872,232 B2
(45) Date of Patent: Oct. 28, 2014

(54) COMPOUND SEMICONDUCTOR DEVICE AND METHOD FOR MANUFACTURING THE SAME

(75) Inventor: Tadahiro Imada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/326,533

(22) Filed: Dec. 15, 2011

(65) Prior Publication Data

US 2012/0218783 A1 Aug. 30, 2012

(30) Foreign Application Priority Data

Feb. 25, 2011 (JP) .................. 2011-040617

(51) Int. Cl.
| | |
|---|---|
| *H01L 29/66* | (2006.01) |
| *H01L 29/06* | (2006.01) |
| *H01L 29/778* | (2006.01) |
| *H01L 29/40* | (2006.01) |
| *H01L 29/861* | (2006.01) |
| *H01L 29/51* | (2006.01) |
| *H01L 29/423* | (2006.01) |
| *H01L 29/45* | (2006.01) |
| *H01L 29/20* | (2006.01) |

(52) U.S. Cl.
CPC ........ *H01L 29/7787* (2013.01); *H01L 29/0619* (2013.01); *H01L 29/517* (2013.01); *H01L 29/402* (2013.01); *H01L 29/42356* (2013.01); *H01L 29/518* (2013.01); *H01L 29/452* (2013.01); *H01L 29/2003* (2013.01); *H01L 29/861* (2013.01); *H01L 29/66462* (2013.01)
USPC ............. 257/194; 257/14; 257/43; 257/76; 438/46; 438/47; 438/172

(58) Field of Classification Search
None
See application file for complete search history.

(56) References Cited

U.S. PATENT DOCUMENTS

| | | | | | |
|---|---|---|---|---|---|
| 5,479,028 | A | * | 12/1995 | Tomioka et al. | 257/76 |
| 2009/0068779 | A1 | * | 3/2009 | Nakahara | 438/47 |
| 2010/0155720 | A1 | * | 6/2010 | Kaneko | 257/43 |

FOREIGN PATENT DOCUMENTS

| | | |
|---|---|---|
| CN | 101176213 A | 5/2008 |
| JP | 2008-71988 A | 3/2008 |
| JP | 2009-49288 A | 3/2009 |
| JP | 2010-153493 A | 7/2010 |

OTHER PUBLICATIONS

Chinese Office Action of CN Patent Application No. 201110456942.7 dated Feb. 12, 2014, with English Translation, 22 pages.

* cited by examiner

*Primary Examiner* — Kyoung Lee
(74) *Attorney, Agent, or Firm* — Fujitsu Patent Center

(57) ABSTRACT

There is embodied a high-reliability high-voltage resistance compound semiconductor device capable of improving the speed of device operation, being high in avalanche resistance, being resistant to surges, eliminating the need to connect any external diodes when applied to, for example, an inverter circuit, and achieving stable operation even if holes are produced, in addition to alleviating the concentration of electric fields on a gate electrode and thereby realizing a further improvement in voltage resistance. A gate electrode is formed so as to fill an electrode recess formed in a structure of stacked compound semiconductors with an electrode material through a gate insulation film, and a field plate recess formed in the structure of stacked compound semiconductors is filled with a p-type semiconductor, thereby forming a field plate the p-type semiconductor layer of which has contact with the structure of stacked compound semiconductors.

16 Claims, 19 Drawing Sheets

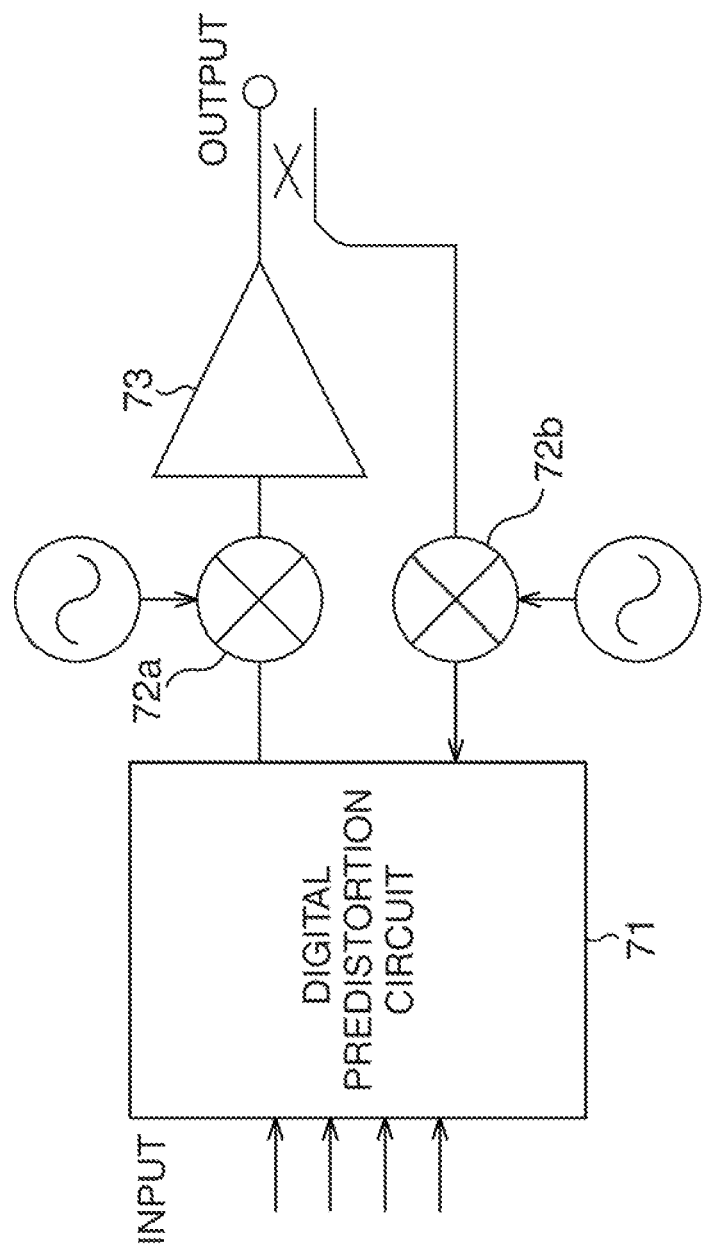

COMPOUND SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2011-040617, filed on Feb. 25, 2011, the entire contents of which are incorporated herein by reference.

FIELD

The embodiments described herein relate to a compound semiconductor device and a method for manufacturing the compound semiconductor device.

BACKGROUND

A study is being made on the application of a nitride semiconductor to high-voltage resistance high-output semiconductor devices by taking advantage of the characteristic features of the nitride semiconductor, such as high saturated electron velocity, a wide bandgap and the like. For example, the bandgap of GaN which is a nitride semiconductor is 3.4 eV, higher than the bandgap (1.1 eV) of and Si and the bandgap (1.4 eV) of GaAs, thus having high breakdown field strength. Accordingly, GaN holds great promise as a material of a semiconductor device for power supplies from which high-voltage operation and high output are available.

Many reports have been made of a field-effect transistor, a high electron mobility transistor (HEMT) in particular, as a semiconductor device using a nitride semiconductor. For example, an AlGaN/GaN HEMT using GaN as an electron transit layer and AlGaN as an electron supply layer is a focus of attention as a GaN-based HEMT (GaN-HEMT). In the AlGaN/GaN HEMT, strain due to a difference in lattice constant between GaN and AlGaN arises in AlGaN. Consequently, there is obtained a high-concentration two-dimensional electron gas (2DEG) due to piezoelectric polarization and the spontaneous polarization of AlGaN caused by the strain. Accordingly, the HEMT is expected for use as a high-efficiency switch element or a high-voltage resistance power device for electric vehicles and the like.

[Patent Document 1] Japanese Laid-Open Patent Publication No. 2010-153493

[Patent Document 2] Japanese Laid-Open Patent Publication No. 2009-49288

[Patent Document 3] Japanese Laid-Open Patent Publication No. 2008-71988

However, the GaN-HEMT has the disadvantage of generally lacking avalanche resistance and being significantly vulnerable to surges. In addition, unlike Si-based semiconductor devices, the GaN-HEMT does not have a body diode. Consequently, a diode needs to be connected externally as a so-called freewheel diode (FWD), in order to apply the GaN-HEMT to, for example, an inverter circuit (full-bridge inverter circuit).

In the GaN-HEMT, a parasitic capacitance Cgs between a gate electrode and a source electrode and a parasitic capacitance Cgd between the gate electrode and a drain electrode may increase due to the concentration of 2DEG being high. Hence, in order to reduce the parasitic capacitances Cgs and Cgd, a field plate using a metal material is formed in some cases on a gate insulation film, so as to be adjacent to the gate electrode on the drain electrode side. In this case, however, the parasitic capacitances Cds and Cgd are large since a depletion layer has difficulty in extending under the field plate. Thus, there is concern that the large capacitances may degrade the speed of device operation. When the field plate is provided, voltage resistance is secured by an insulation film (a gate insulation film, for example) interposed between the field plate and a compound semiconductor layer. This causes another problem that electric fields center on the insulation film, and thus voltage resistance fails to be improved. It is also viewed as a problem that electron holes produced by impact ionization or the like permanently exist in a device.

SUMMARY

One aspect of a compound semiconductor device includes a structure of stacked compound semiconductors, a gate electrode formed on the structure of stacked compound semiconductors, and a semiconductor layer formed on the structure of stacked compound semiconductors and having a conductivity type opposite to a conductivity type that the structure of stacked compound semiconductors has.

One aspect of a method for manufacturing a compound semiconductor device includes forming a gate electrode on a structure of stacked compound semiconductors, and forming a semiconductor layer having a conductivity type opposite to a conductivity type that the structure of stacked compound semiconductors has on the structure of stacked compound semiconductors.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 21 is a connection wiring diagram illustrating a schematic configuration of a high-frequency amplifier according to a fifth embodiment.

DESCRIPTION OF EMBODIMENTS

Figure 1A:
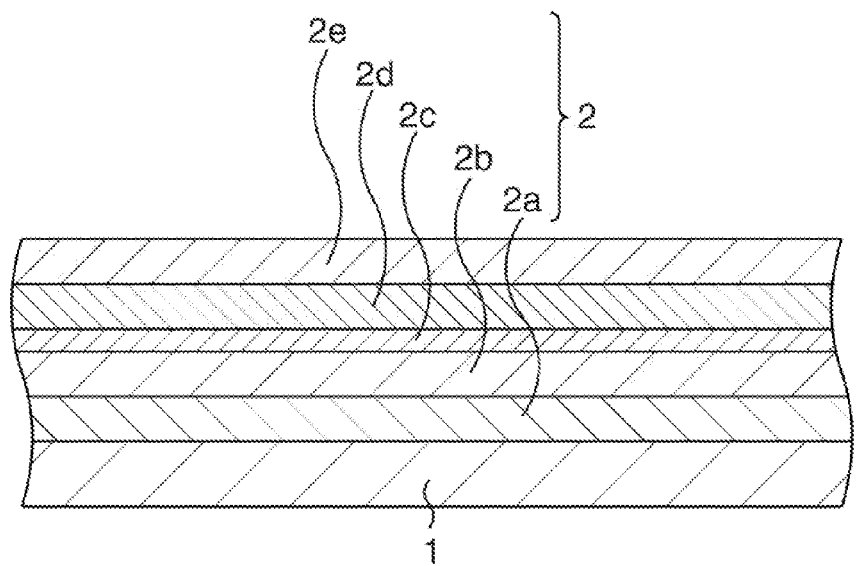
FIG. 1A to FIG. 1C are schematic cross-sectional views illustrating a method for manufacturing an AlGaN/GaN HEMT according to a first embodiment in the order of steps.

Hereinafter, embodiments will be described in detail with reference to the accompanying drawings. In the below-described embodiments, a configuration of each compound semiconductor device will be described along with a method for manufacturing the compound semiconductor device.

Note that for convenience of illustration, some components are illustrated not in conformity to the relatively correct sizes and thicknesses thereof in the drawings cited below.

First Embodiment

The present embodiment discloses an AlGaN/GaN HEMT as a compound semiconductor device.

FIGS. 1A to 4B are schematic cross-sectional views illustrating a method for manufacturing an AlGaN/GaN HEMT according to a first embodiment in the order of steps.

First, as illustrated in FIG. 1A, a structure of stacked compound semiconductors 2 is formed on, for example, an Si substrate 1 as a substrate for growth. As the substrate for growth, a sapphire substrate, a GaAs substrate, an SiC substrate, a GaN substrate, or the like may be used in place of the Si substrate. In addition, the conductive property of a substrate may be of any type, whether semi-insulating or electroconductive.

The structure of stacked compound semiconductors 2 includes a buffer layer 2a, an electron transit layer 2b, an intermediate layer 2c, an electron supply layer 2d, and a cap layer 2e.

In a completed AlGaN/GaN HEMT, a two-dimensional electron gas (2DEG) is generated in the vicinity of an interface of the electron transit layer 2b with the electron supply layer 2d (intermediate layer 2c, to be exact) at the time of operating the AlGaN/GaN HEMT. This 2DEG is generated based on a difference in lattice constant between the compound semiconductor (GaN here) of the electron transit layer 2b and the compound semiconductor (AlGaN here) of the electron supply layer 2d.

Specifically, the below-described respective compound semiconductors are grown on the Si substrate 1 by, for example, a metal organic vapor phase epitaxy (MOVPE) method. A molecular beam epitaxy (MBE) method or the like may be used instead of the MOVPE method.

On the Si substrate 1, AlN is grown to a thickness of approximately 0.1 μm, i (intentionally undoped)-GaN is grown to a thickness of approximately 3 μm, i-AlGaN is grown to a thickness of approximately 5 nm, n-AlGaN is grown to a thickness of approximately 30 nm, and n-GaN is grown to a thickness of approximately 10 nm, in the order mentioned. Consequently, there are formed the buffer layer 2a, the electron transit layer 2b, the intermediate layer 2c, the electron supply layer 2d, and the cap layer 2e.

For the growth conditions of AlN, GaN, AlGaN and GaN, a mixed gas composed of a trimethyl aluminum gas, a trimethyl gallium gas and an ammonia gas are used as raw material gases. Whether or not to supply the trimethyl aluminum gas which is an Al source and/or the trimethyl gallium gas which is a Ga source is determined and the flow rates of the gases are set, as appropriate, according to a compound semiconductor layer to be grown. The flow rate of the ammonia gas which is a common raw material is set to approximately 100 ccm to 10 LM. In addition, growth pressure is set to approximately 50 Torr to 300 Torr, and growth temperature is set to approximately 1000° C. to 1200° C.

When GaN and AlGaN are grown as n-type semiconductors, an Si-containing $SiH_4$ gas, for example, is added as an n-type impurity to a raw material gas at a predetermined flow rate, so that GaN and AlGaN are doped with Si. The doping concentration of Si is set to approximately $1 \times 10^{18}/cm^3$ to $1 \times 10^{20}/cm^3$, for example, approximately $5 \times 10^{18}/cm^3$.

Figure 1B:
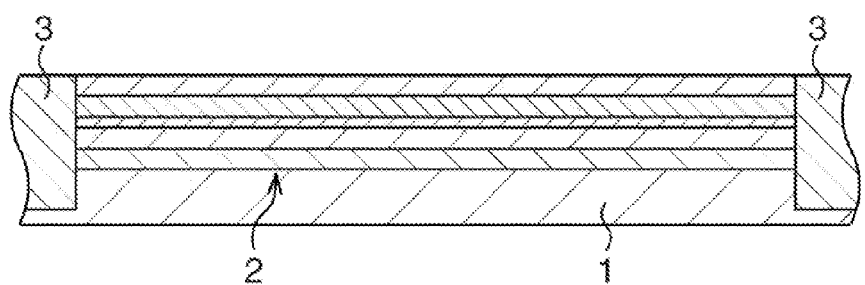
Figure 2A:
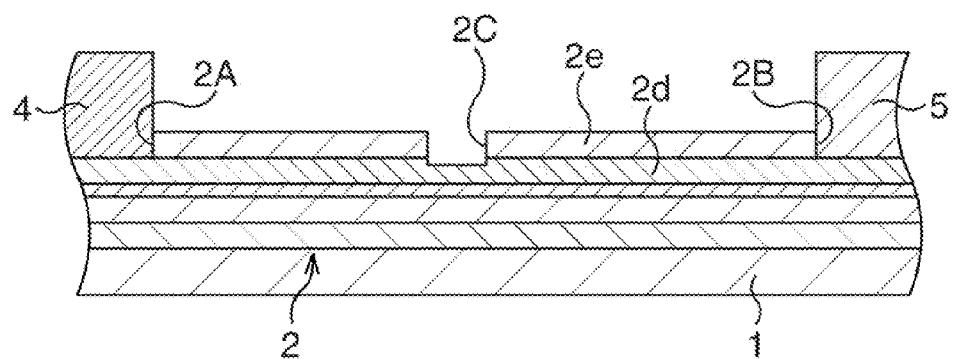
FIG. 2A to FIG. 2C are schematic cross-sectional views illustrating the method for manufacturing the AlGaN/GaN HEMT according to the first embodiment in the order of steps following the steps of FIG. 1A and FIG. 1C.

Subsequently, as illustrated in FIG. 1B, an element isolation structure 3 is formed. In FIG. 2A and subsequent figures, the element isolation structure 3 will not be illustrated.

Specifically, argon (Ar), for example, is implanted in an element-isolating region of the structure of stacked compound semiconductors 2. Consequently, element isolation structures 3 are formed in surface layer parts of the structure of stacked compound semiconductors 2 and the Si substrate 1. Thus, an active region is defined on the structure of stacked compound semiconductors 2 by the element isolation structures 3.

Note that element isolation may be performed using another known method, for example, an STI (Shallow Trench Isolation) method, instead of the above-described implantation method. At this time, a chlorine-based etching gas, for example, is used for the dry etching of the structure of stacked compound semiconductors 2.

Figure 1C:
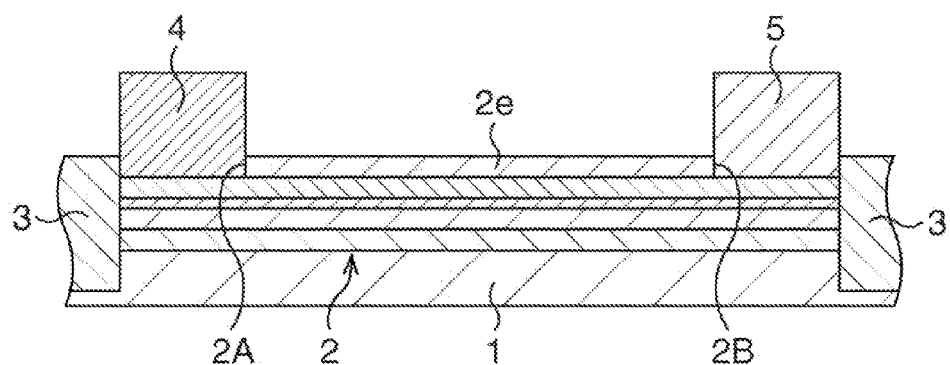

Subsequently, as illustrated in FIG. 1C, a source electrode 4 and a drain electrode 5 are formed.

Specifically, first, electrode recesses 2A and 2B are formed on a surface of the structure of stacked compound semiconductors 2 in positions in which the source and drain electrodes are to be formed (positions of electrodes scheduled to be formed therein).

Resist is coated on the surface of the structure of stacked compound semiconductors 2. The resist is processed by means of lithography, so that openings to expose surface portions of the structure of stacked compound semiconductors 2 corresponding to the positions of electrodes scheduled to be formed therein are formed in the resist. Consequently, there is formed a resist mask having the abovementioned openings.

Using this resist mask, portions of the cap layer 2e in the positions of electrodes scheduled to be formed therein are removed by dry etching until a surface of the electron supply layer 2d becomes exposed. Consequently, there are formed the electrode recesses 2A and 2B to expose surface portions of the electron supply layer 2d in the positions of electrodes scheduled to be formed therein. For etching conditions, an inert gas such as Ar and a chlorine-based gas such as $Cl_2$ are used as etching gases and, for example, $Cl_2$ is set to have a flow rate of 30 sccm, pressure is set to 2 Pa, and RF input power is set to 20 W. Note that the electrode recesses 2A and 2B may be formed by etching the cap layer 2e halfway therethrough or by etching the cap layer 2e through to the electron supply layer 2d or beyond.

The resist mask is removed by asking treatment or the like.

A resist mask for forming the source and drain electrodes is formed. Here, eaves-structured two-layer resist suited for an evaporation method and a liftoff method, for example, is used. This resist is coated on the structure of stacked compound semiconductors 2 to form openings to expose the electrode recesses 2A and 2B. Consequently, there is formed the resist mask having the above-mentioned openings.

Using this resist mask, Ta and Al, for example, are deposited as electrode materials by, for example, an evaporation method on the resist mask, including the interiors of the openings to expose the electrode recesses 2A and 2B. The thickness of Ta is set to approximately 20 nm, and the thickness of Al is set to approximately 200 nm. The resist mask and Ta and Al deposited thereon are removed by a liftoff method. Thereafter, the Si substrate 1 is heat-treated in, for example, a nitrogen atmosphere at a temperature of 400° C. to 1000° C., for example, approximately 600° C., thereby causing remaining Ta and Al to have ohmic contact with the electron supply layer 2d. Heat treatment may not be necessary as long as the ohmic contact of Ta and Al with the electron supply layer 2d is available. Consequently, there are formed the source electrode 4 and the drain electrode 5 in which the electrode recesses 2A and 2B are filled with part of an electrode material.

Subsequently, as illustrated in FIG. 2A, an electrode recess 2C for a gate electrode is formed in the structure of stacked compound semiconductors 2.

Specifically, first, resist is coated on a surface of the structure of stacked compound semiconductors 2. The resist is processed by means of lithography, so that an opening to expose a surface portion of the structure of stacked compound semiconductors 2 corresponding to a position in which a gate electrode is to be formed (position of an electrode scheduled to be formed therein) is formed in the resist. Consequently, there is formed a resist mask having the abovementioned opening.

Using this resist mask, portions of the cap layer 2e and the electron supply layer 2d in the position of an electrode scheduled to be formed therein are removed by dry etching. Consequently, there is formed the electrode recess 2C dug through the cap layer 2e up to part of the electron supply layer 2d. For etching conditions, an inert gas such as Ar and a chlorine-based gas such as $Cl_2$ are used as etching gases and, for example, $Cl_2$ is set to have a flow rate of 30 sccm, pressure is set to 2 Pa, and RF input power is set to 20 W. Note that the electrode recess 2C may be formed by etching the cap layer 2e halfway therethrough or by etching the cap layer 2e through to a deeper portion of the electron supply layer 2d.

The resist mask is removed by asking treatment or the like.

Figure 2B:
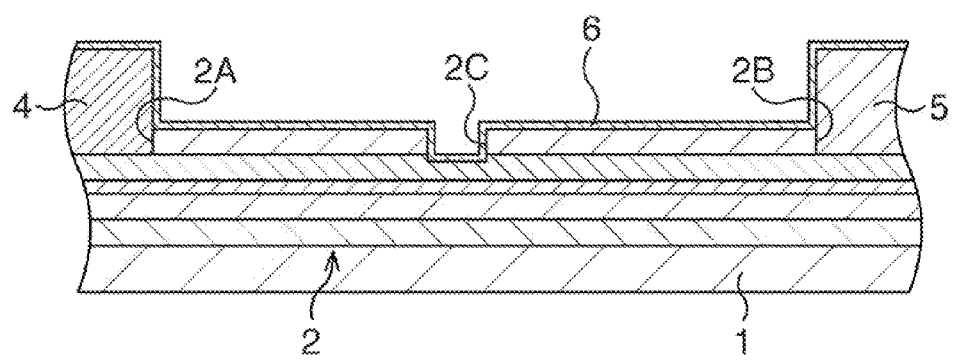

Subsequently, as illustrated in FIG. 2B, a gate insulation film 6 is formed.

Specifically, $Al_2O_3$, for example, is deposited as an insulating material on the structure of stacked compound semiconductors 2, so as to cover the inner wall surfaces of the electrode recess 2C. $Al_2O_3$ is deposited by, for example, an atomic layer deposition method (ALD method) to a film thickness of approximately 2 nm to 200 nm, approximately 10 nm here. Consequently, there is formed the gate insulation film 6.

Note that $Al_2O_3$ may be deposited by, for example, a plasma CVD method or a sputtering method instead of the ALD method. A nitride or oxynitride of Al may be used and deposited instead of depositing $Al_2O_3$. In addition to the nitride and oxynitride of Al, an oxide, nitride or oxynitride of Si, Hf, Zr, Ti, Ta or W may be used. Alternatively, a selection may be made as appropriate from these oxides, nitrides or oxynitrides to deposit the selected material into a multilayer, thereby forming the gate insulation film.

The present embodiment discloses a so-called MIS-type AlGaN/GaN HEMT in which the gate insulation film 6 is provided between the gate electrode and the structure of stacked compound semiconductors 2. The present embodiment is not limited to this HEMT, however. Alternatively, there may be formed a so-called Schottky-type AlGaN/GaN HEMT in which the gate electrode is formed, without forming the gate insulation film 6, so as to directly have contact (Schottky contact) with the structure of stacked compound semiconductors.

Figure 2C:
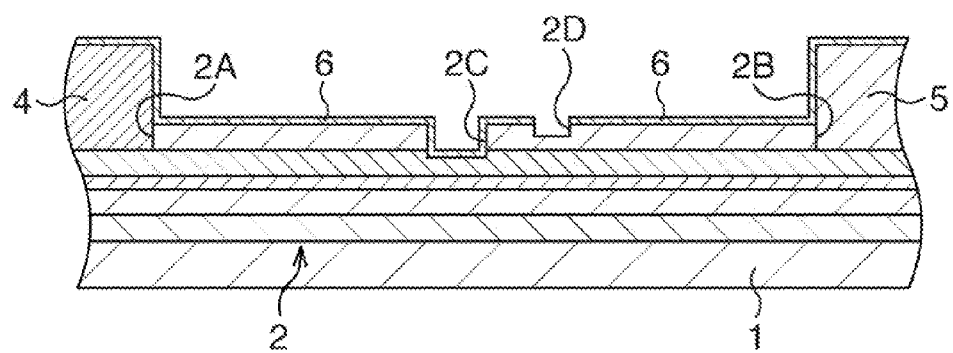

Subsequently, as illustrated in FIG. 2C, a field plate recess 2D for a field plate is formed in the structure of stacked compound semiconductors 2.

Specifically, first, resist is coated on the gate insulation film 6. The resist is processed by means of lithography, so that an opening to expose a surface portion of the gate insulation film 6 corresponding to a position in which a field plate is to be formed (position of an electrode scheduled to be formed therein) is formed in the resist. Consequently, there is formed a resist mask having the abovementioned opening. Note that this position of an electrode scheduled to be formed therein is defined as a predetermined location between the electrode recess 2C of the gate electrode and the drain electrode 5.

Using this resist mask, portions of the gate insulation film 6 and the cap layer 2e in the position of an electrode scheduled to be formed therein are removed by dry etching. Consequently, there is formed the field plate recess 2D dug through to part of the cap layer 2e. The field plate recess 2D is formed so that the longitudinal direction thereof is parallel along the longitudinal direction of the electrode recess 2C. For etching conditions, an alkaline aqueous solution, such as a KOH aqueous solution or a TMAH aqueous solution, is used as an etchant for the etching of the gate insulation film 6 and, for example, a concentration (KOH aqueous solution) is used. For the etching of the cap layer 2e, an inert gas such as Ar and a chlorine-based gas such as $Cl_2$ are used as etching gases and, for example, $Cl_2$ is set to have a flow rate of 30 sccm, pressure is set to 2 Pa, and RF input power is set to 20 W.

The resist mask is removed by asking treatment or the like.

The field plate recess 2D may be formed by etching the cap layer 2e until a surface of the electron supply layer 2d becomes exposed, or by etching the cap layer 2e through to a deeper portion of the electron supply layer 2d. Note that in the present embodiment, a case is shown by way of example in which the field plate recess 2D of the field plate is formed to a depth less than the depth of the electrode recess 2C of the gate electrode when viewed with reference to a surface of the structure of the stacked compound semiconductors 2 (surface of the cap layer 2e). The present embodiment is not limited to this case, however.

Figure 3A:
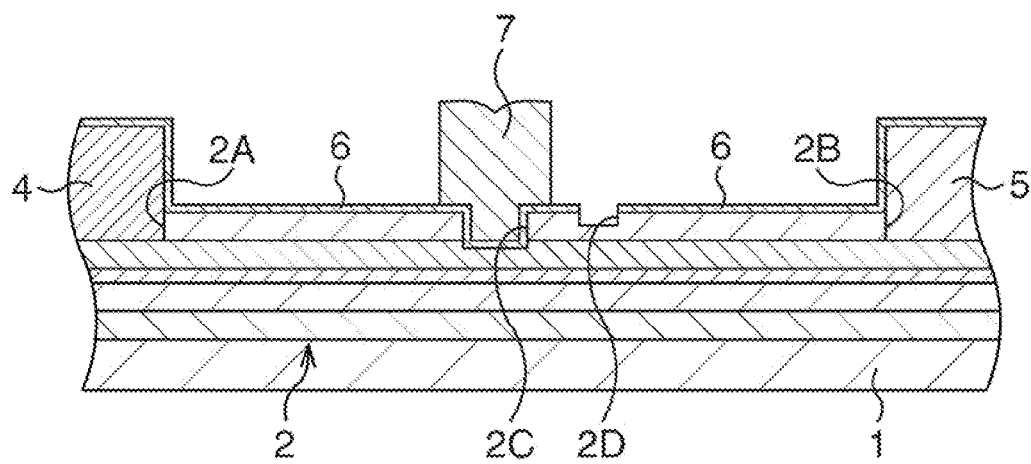
FIG. 3A and FIG. 3B are schematic cross-sectional views illustrating the method for manufacturing the AlGaN/GaN HEMT according to the first embodiment in the order of steps following the steps of FIG. 2A to FIG. 2C.

Subsequently, as illustrated in FIG. 3A, a gate electrode 7 is formed.

Specifically, first, a resist mask for forming a gate electrode is formed. Here, eaves-structured two-layer resist suited for an evaporation method and a liftoff method, for example, is used. This resist is coated on the gate insulation film 6 to form an opening to expose a portion of the gate insulation film 6 corresponding to the electrode recess 2C. Consequently, a resist mask having the above-mentioned opening is formed.

Using this resist mask, Ni and Au, for example, are deposited as electrode materials by, for example, an evaporation method on the resist mask, including the interior of the opening to expose the portion of the gate insulation film 6 corresponding to the electrode recess 2C. The thickness of Ni is set to approximately 30 nm, and the thickness of Au is set to approximately 400 nm. The resist mask and Ni and Au deposited thereon are removed by a liftoff method. Consequently, there is formed the gate electrode 7 in which the interior of the electrode recess 2C is filled with part of an electrode material through the gate insulation film 6.

Figure 3B:
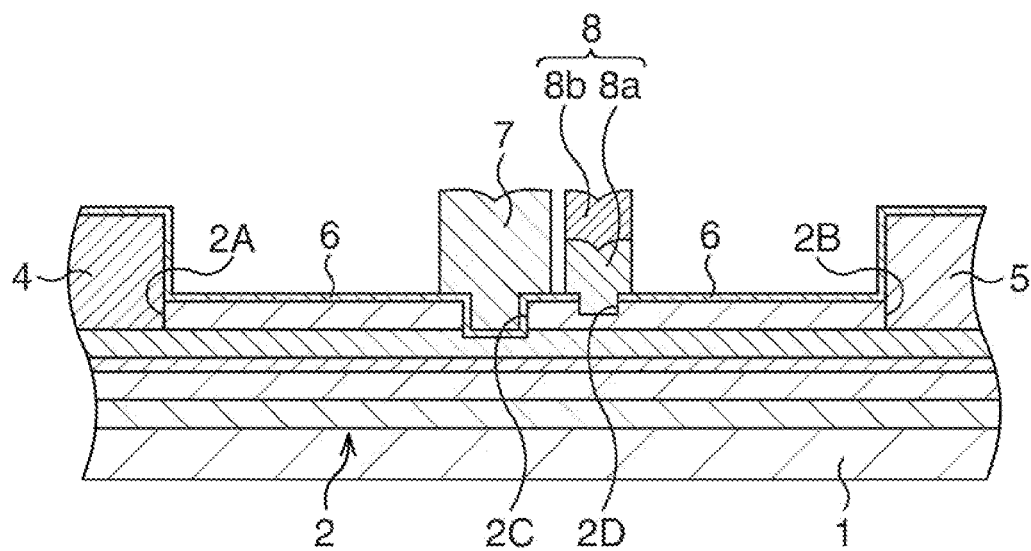

Subsequently, as illustrated in FIG. 3B, a field plate 8 is formed.

Specifically, first, a conductive oxide which, when formed, exhibits the properties of a p-type semiconductor is deposited here by, for example, a sputtering method on the entire surface of the HEMT being fabricated, including the interior of the field plate recess 2D, as a semiconductor of a conductivity type opposite to a conductivity type that the structure of the stacked compound semiconductors 2 has, i.e., as a p-type semiconductor. As this conductive oxide, one or a plurality of materials selected from the group consisting of $NiO$, $FeO_2$, $CoO_2$, $MnO$, $CuO$, $ZnO$, $In_2O_3$, $SnO_2$, $Y_2O_3$, $SrTiO_3$, $SrPbO_3$ and $TiO_2$ is used. Here, NiO is used and deposited to a thickness of, for example, approximately 50 nm.

Instead of depositing this conductive oxide, p-type Si may be deposited by, for example, a CVD method. In this case, Si is doped with a p-type impurity (such as boron (B)) and then deposited, or the p-type impurity is ion-implanted into Si after the deposition of Si.

The deposited NiO is processed by means of lithography and dry etching, so as to remain in a position in which the field plate is to be formed (position of an electrode scheduled to be formed therein), including the interior of the field plate recess 2D. Consequently, there is formed a p-type semiconductor layer 8a in which the interior of the field plate recess 2D is filled with part of NiO.

Next, a connecting electrode 8b is formed on the p-type semiconductor layer 8a.

First, a resist mask for forming the connecting electrode is formed. Resist is coated on the entire surface of the HEMT being fabricated to form an opening to expose the p-type semiconductor layer 8a. Consequently, there is formed the resist mask having the abovementioned opening.

Using this resist mask, Ni and Au, for example, are deposited as electrode materials by, for example, an evaporation method on the resist mask, including the interior of the opening to expose an upper surface of the p-type semiconductor layer 8a. The thickness of Ni is set to approximately 30 nm, and the thickness of Au is set to approximately 400 nm. The resist mask and Ni and Au deposited thereon are removed by a liftoff method. Consequently, there is formed, on the p-type semiconductor layer 8a, the connecting electrode 8b having ohmic contact therewith. An electrode material of the connecting electrode 8b may be any conductive material, as along as the conductive material allows ohmic contact to be made with p-type semiconductors. Accordingly, Ti, Pd or Ta or an alloy thereof can be used in place of Ni and Au. In some cases, a conductive material that does not allow for ohmic contact can be applied, as long as the conductive material allows the connecting electrode 8b to be electrically connected to a p-type semiconductor.

Consequently, there is formed the field plate 8 composed of the p-type semiconductor layer 8a and the connecting electrode 8b. In the field plate 8, the p-type semiconductor layer 8a thereof directly has contact with the cap layer 2e of the structure of the stacked compound semiconductors 2 in part of the internal side surfaces of the field plate recess 2D and in the bottom face thereof.

Figure 5:
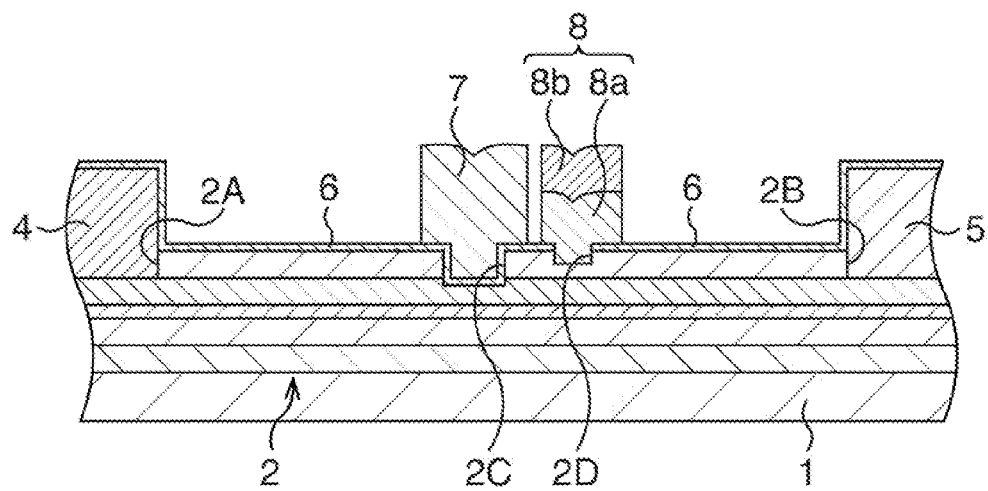
FIG. 5 is a schematic cross-sectional view illustrating another example of the AlGaN/GaN HEMT according to the first embodiment.

The field plate 8 may be formed into a shape biased in a direction not facing the adjacent gate electrode 7, i.e., toward the drain electrode 5. Specifically, as illustrated in FIG. 5, a portion of the field plate 8 on the drain electrode 5 side is extendedly formed on the gate insulation film 6. In an AlGaN/GaN HEMT, a larger voltage may be applied, in some cases, to a drain electrode than to a source electrode and a gate electrode. Even in these cases, adopting this configuration enables the field plate 8 to alleviate electric fields generated due to the application of a large voltage.

Figure 4A:
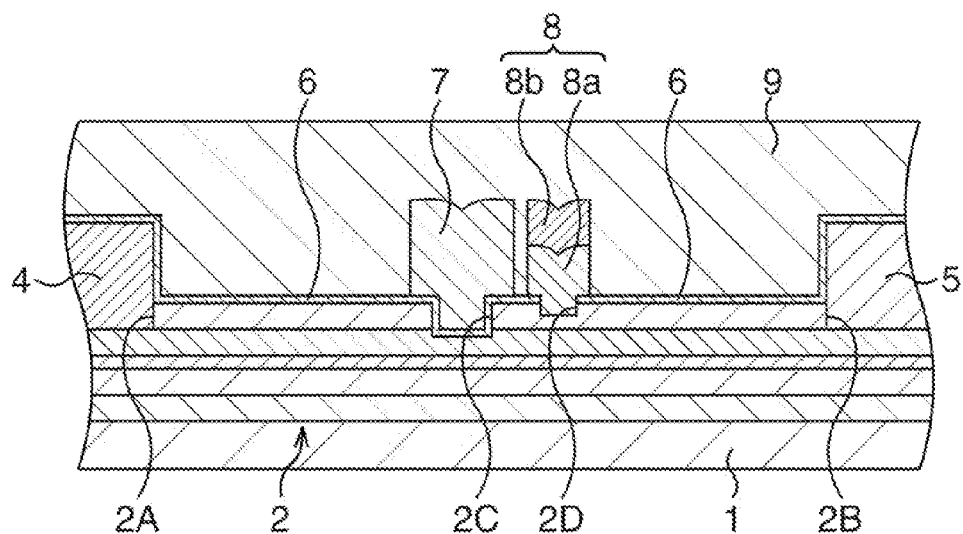
FIG. 4A and FIG. 4B are schematic cross-sectional views illustrating the method for manufacturing the AlGaN/GaN HEMT according to the first embodiment in the order of steps following the steps of FIG. 3A and FIG. 3B.

Subsequently, as illustrated in FIG. 4A, an interlayer insulation film 9 is formed.

Specifically, an insulating material, for example, SiN is deposited on the entire surface of the Si substrate 1 by a CVD method or the like, so as to cover the source electrode 4, the drain electrode 5, the gate electrode 7, and the field plate 8. Consequently, there is formed the interlayer insulation film 9.

Figure 4B:
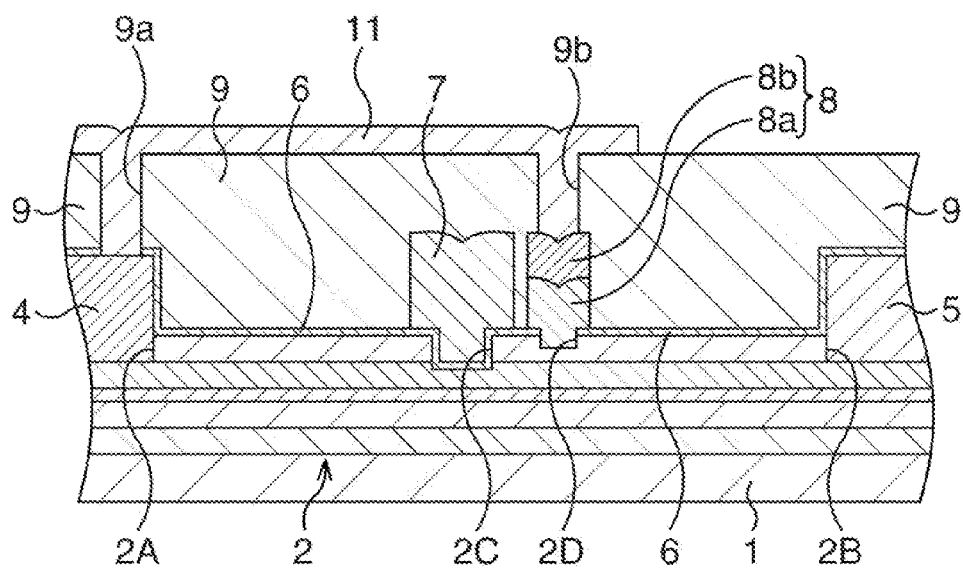

Subsequently, as illustrated in FIG. 4B, an interconnect layer 11 is formed.

Specifically, first, the interlayer insulation film 9 and the gate insulation film 6 are processed by means of lithography and dry etching. Consequently, there are formed openings 9a and 9b to expose respective surface portions of the source electrode 4 and the field plate 8.

A conductive material, for example, Au is deposited on the interlayer insulation film 9 by an evaporation method or the like, so as to fill the interiors of the openings 9a and 9b.

The deposited Au is processed by means of lithography and dry etching. Consequently, there is formed, on the interlayer insulation film 9, an interconnect layer 11 by which the interiors of the openings 9a and 9b are filled with the conductive material and the source electrode 4 and the field plate 8 are electrically connected to each other.

In the present embodiment, a case has been shown by way of example in which the source electrode 4 and the connecting electrode 8b of the field plate 8 are electrically connected to each other. Alternatively, an interconnect layer may be formed between the gate electrode 7 and the field plate 8 to electrically connect the gate electrode 7 and the field plate 8 to each other.

Thereafter, an AlGaN/GaN HEMT according to the present embodiment is formed after being made to go through steps, including a step of forming an upper-layer protective film.

In the AlGaN/GaN HEMT according to the present embodiment, the gate electrode 7 is formed so as to fill the electrode recess 2C through the gate insulation film 6. High-voltage resistance normally-off operation required of HEMTs is made possible by adopting this MIS-type recess gate structure as a premise.

In the present embodiment, the field plate 8 for filling the field plate recess 2D is provided so as to be adjacent to the gate electrode 7 on the drain electrode 5 side thereof. The field plate 8 has, in the lower portion thereof, a semiconductor layer of a conductivity type opposite to a conductivity type that the structure of the stacked compound semiconductors 2 has, i.e., a p-type semiconductor layer 8a. This p-type semiconductor layer 8a becomes depleted for reasons of relation with the n-type semiconductor (n-AlGaN of the electron supply layer 2d and n-GaN of the cap layer 2e) of the structure of the stacked compound semiconductors 2. Thus, a depletion layer extends and expands under the p-type semiconductor layer 8a. Consequently, electric fields applied to an edge portion of the gate electrode 7 are sufficiently alleviated by adopting the field plate having a recess structure. In addition, voltage resistance is significantly improved due to the extension of the depletion layer. Yet additionally, parasitic capacitances Cds and Cgd are greatly reduced due to the extension of the depletion layer caused by the p-type semiconductor layer 8a. Thereby, the increased speed of device operation is realized.

Figure 6:
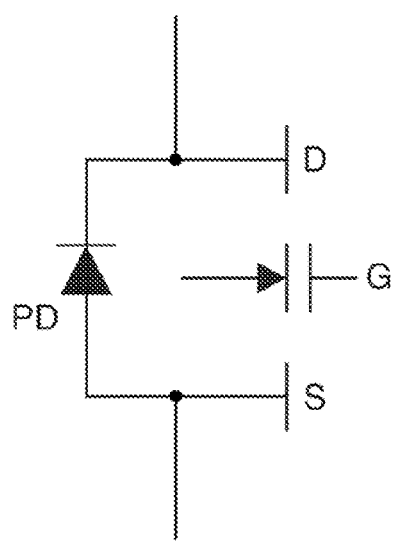
FIG. 6 is a drawing illustrating an equivalent circuit diagram of the AlGaN/GaN HEMT according to the first embodiment.

Still additionally, in the present embodiment, a pn-junction is formed between NiO of the p-type semiconductor layer 8a and n-GaN of the cap layer 2e by adopting the field plate 8 in which the structure of stacked compound semiconductors 2 and the p-type semiconductor layer 8a have contact with each other. Consequently, there is imparted the function of a protective diode in which the connecting electrode 8b of the field plate 8 serves as an anode and the drain electrode 5 serves as a cathode. FIG. 6 illustrates an equivalent circuit diagram of this AlGaN/GaN HEMT. The gate electrode, source electrode and drain electrode of the HEMT are represented as G, S and D, respectively, and the protective diode of the HEMT is represented as PD. Even if a surge voltage arises in the AlGaN/GaN HEMT, the AlGaN/GaN HEMT is prevented from breakdown by the commutating action of the PD. As described above, the present embodiment ensures adequate avalanche resistance and contributes to stabilizing device operation.

Here, a description will be given of experiments in which the characteristics of the AlGaN/GaN HEMT according to the present embodiment were examined. As a comparative example of the present embodiment, an AlGaN/GaN HEMT provided with a field plate made of metal formed on a structure of stacked compound semiconductors through a gate insulation film will be shown by way of example.

Figure 7:
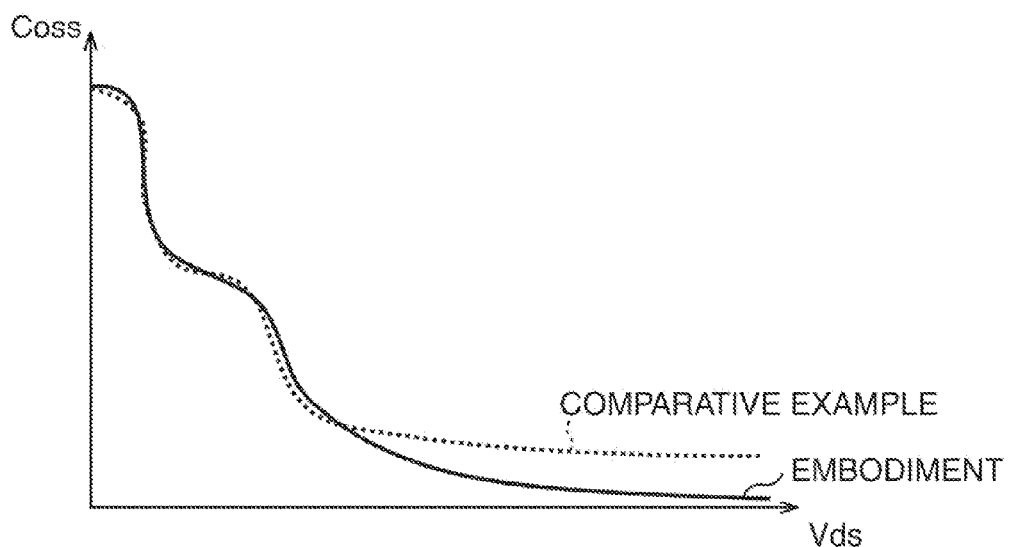
FIG. 7 is a characteristic drawing illustrating a relationship between a drain-source voltage Vds and an output capacitance Coss.

In Experiment 1, an examination was made of a relationship between drain-source voltage Vds and an output capacitance Coss. FIG. 7 illustrates the result of the experiment. From this result, a substantial reduction in the output capacitance Coss was confirmed in the present embodiment, compared with the comparative example.

Figure 8:
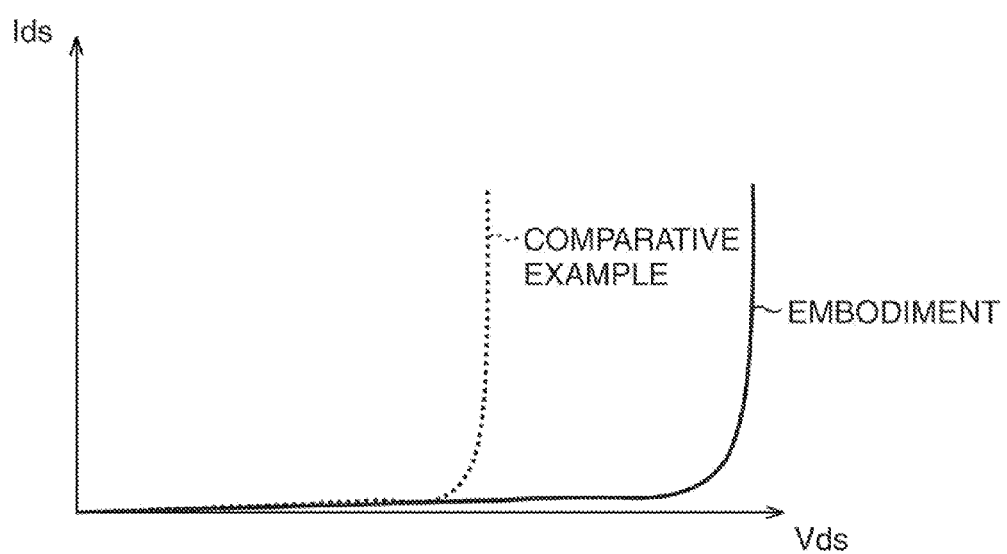
FIG. 8 is a characteristic drawing illustrating a relationship between the drain-source voltage Vds and a drain-source current Ids.

In Experiment 2, an examination was made of a relationship between the drain-source voltage Vds and a drain-source current Ids. FIG. 8 illustrates the result of the experiment. From this result, it was confirmed that an off-leakage current reduced and a withstand voltage characteristic improved in the present embodiment, compared with the comparative example.

As has been described heretofore, according to the present embodiment, there is embodied a high-reliability high-voltage resistance AlGaN/GaN HEMT capable of improving the speed of device operation, being high in avalanche resistance, being resistant to surges, eliminating the need to connect any external diodes when applied to, for example, an inverter circuit, and achieving stable operation even if holes are produced, in addition to alleviating the concentration of electric fields on a gate electrode 7 and thereby realizing a further improvement in voltage resistance.

MODIFIED EXAMPLES

Hereinafter, a description will be given of modified examples of the AlGaN/GaN HEMT according to the first embodiment.

Modified Example 1

The present example discloses an AlGaN/GaN HEMT as in the case of the first embodiment. The modified example differs from the first embodiment, however, in the cap layer of the structure of stacked compound semiconductors. Note that the same components and the like as those of the first embodiment are denoted by like reference numerals and characters and will be described in no further detail here.

FIG. 9 is a schematic cross-sectional view illustrating main steps of a method for manufacturing an AlGaN/GaN HEMT according to Modified Example 1 of the first embodiment.

Figure 9A:
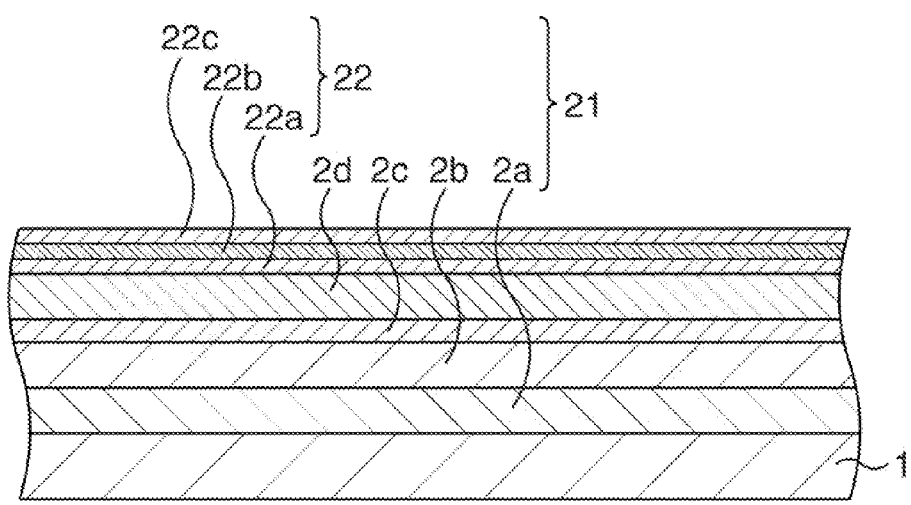
FIG. 9A to FIG. 9C are schematic cross-sectional views illustrating main steps of a method for manufacturing an AlGaN/GaN HEMT according to Modified Example 1 of the first embodiment.

First, as illustrated in FIG. 9A, a structure of stacked compound semiconductors 21 is formed on, for example, an Si substrate 1 as a substrate for growth.

The structure of stacked compound semiconductors 21 includes a buffer layer 2a, an electron transit layer 2b, an intermediate layer 2c, an electron supply layer 2d, and a cap layer 2e.

The cap layer 22 is made to have a stacked structure including a layer made of a compound semiconductor narrower in bandgap than a compound semiconductor (n-AlGaN of the electron supply layer 2d here) of a layer underneath the cap layer 22 and a layer made of a compound semiconductor wider in bandgap than the compound semiconductor of the underneath layer. Here, n-GaN is cited as an example of the former layer and AlN is cited as an example of the latter layer. Three compound semiconductor layers of n-GaN 22a, AlN 22b and n-GaN 22c are sequentially stacked to form the cap layer 22.

Note that the cap layer of this stacked structure may be formed into, for example, a two-layer structure in which n-GaN and AlN are sequentially stacked or a stacked structure of four or more layers, in addition to the above-described structure.

Under the same growth conditions as in the first embodiment, the buffer layer 2a, the electron transit layer 2b, the intermediate layer 2c, the electron supply layer 2d, and the cap layer 22 are sequentially grown and formed by an MOVPE method. The cap layer 22 is formed so that the n-GaN 22a is approximately 2 nm to 3 nm, the AlN 22b is approximately 2 nm to 3 nm, and the n-GaN 22c is approximately 5 nm in film thickness, respectively.

Subsequently, the same steps as those of FIGS. 1B to 2B in the first embodiment are carried out.

At this time, a source electrode 4 and a drain electrode 5 are formed in electrode recesses 21A and 21B of the structure of stacked compound semiconductors 21 and a gate insulation film 6 is formed on the structure of stacked compound semiconductors 21, so as to cover the inner wall surfaces of an electrode recess 21C.

Figure 9B:
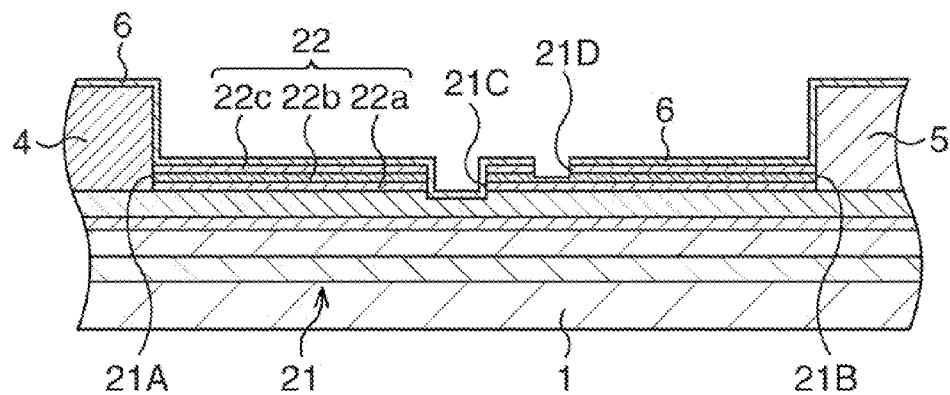

Subsequently, as illustrated in FIG. 9B, a field plate recess 21D is formed in the structure of stacked compound semiconductors 21.

Specifically, first, resist is coated on the gate insulation film 6. The resist is processed by means of lithography, so that an opening to expose a surface portion of the gate insulation film 6 corresponding to a position in which a field plate is to be formed (position of an electrode scheduled to be formed therein) is formed in the resist. Consequently, there is formed a resist mask having the abovementioned opening. Note that this position of an electrode scheduled to be formed therein is defined as a predetermined location between the electrode recess 21C of the gate electrode and the drain electrode 5.

Using this resist mask, portions of the gate insulation film 6 and the cap layer 22 in the position of an electrode scheduled to be formed therein are removed by etching. In the present example, etching is performed under the condition in which AlN is lower in etching rate than GaN by taking advantage of a difference in etching rate between GaN and AlN. That is, n-GaN 22*a* is dry-etched using AlN 22*b*, among the layers of the cap layer 22, as an etching stopper. Consequently, there is formed the electrode recess 21D in which the AlN 22*b* of the cap layer 2*e* is exposed. Note that in practice, part of the surface layer of the AlN 22*b* is also likely to be etched. Accordingly, the electrode recess 21D is illustrated as having been dug through to part of the AlN 22*b*.

For etching conditions, an alkaline aqueous solution, such as a KOH aqueous solution or a TMAH aqueous solution, is used as an etchant for the etching of the gate insulation film 6 and, for example, a concentration (KOH aqueous solution) is used. For the etching of the n-GaN 22*a* of the cap layer 2*e*, an inert gas such as Ar and a chlorine-based gas such as $Cl_2$ are used as etching gases and, for example, $Cl_2$ is set to have a flow rate of 30 sccm, pressure is set to 2 Pa, and RF input power is set to 20 W.

The resist mask is removed by asking treatment or the like.

Note that the electrode recess 21D may be formed by etching the cap layer 22 until a surface of the electron supply layer 2*d* becomes exposed, or by etching the cap layer 22 through to a deeper portion of the electron supply layer 2*d*.

Figure 9C:
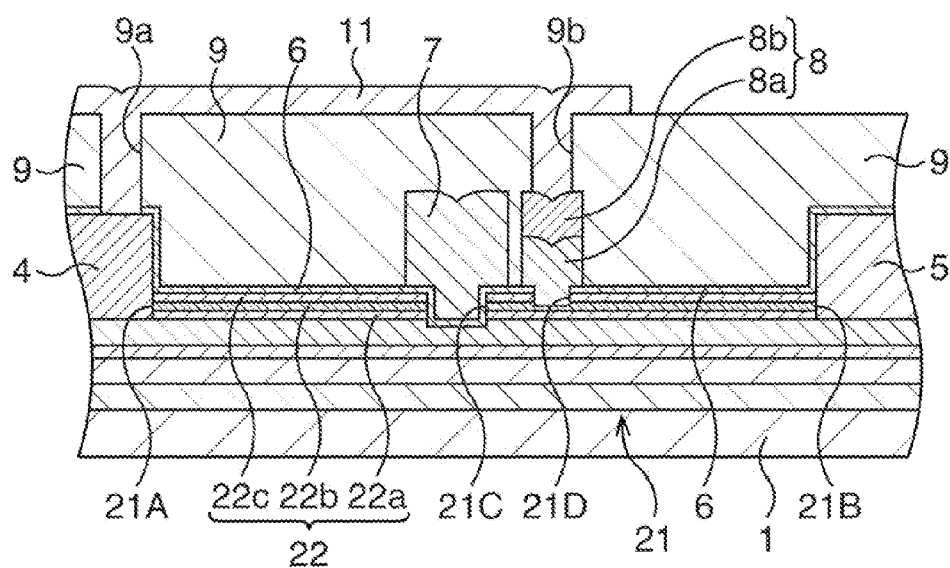

Subsequently, a gate electrode 7 is formed by carrying out the same step as that of FIG. 3A in the first embodiment. Likewise, a field plate 8 is formed by carrying out the same step as that of FIG. 3B. In addition, the same steps as those of FIGS. 4A and 4B are carried out, so that the source electrode 4 and a connecting electrode 8*b* of the field plate 8 are electrically connected to each other by an interconnect layer 11. FIG. 9C illustrates how the HEMT at this stage is viewed.

Thereafter, the AlGaN/GaN HEMT according to the present example is formed after being made to go through steps, including a step of forming an upper-layer protective film.

As has been described heretofore, according to the present example, there is embodied a high-reliability high-voltage resistance AlGaN/GaN HEMT capable of improving the speed of device operation, being high in avalanche resistance, being resistant to surges, eliminating the need to connect any external diodes when applied to, for example, an inverter circuit, and achieving stable operation even if holes are produced, in addition to alleviating the concentration of electric fields on a gate electrode 7 and thereby realizing a further improvement in voltage resistance.

Figure 10:
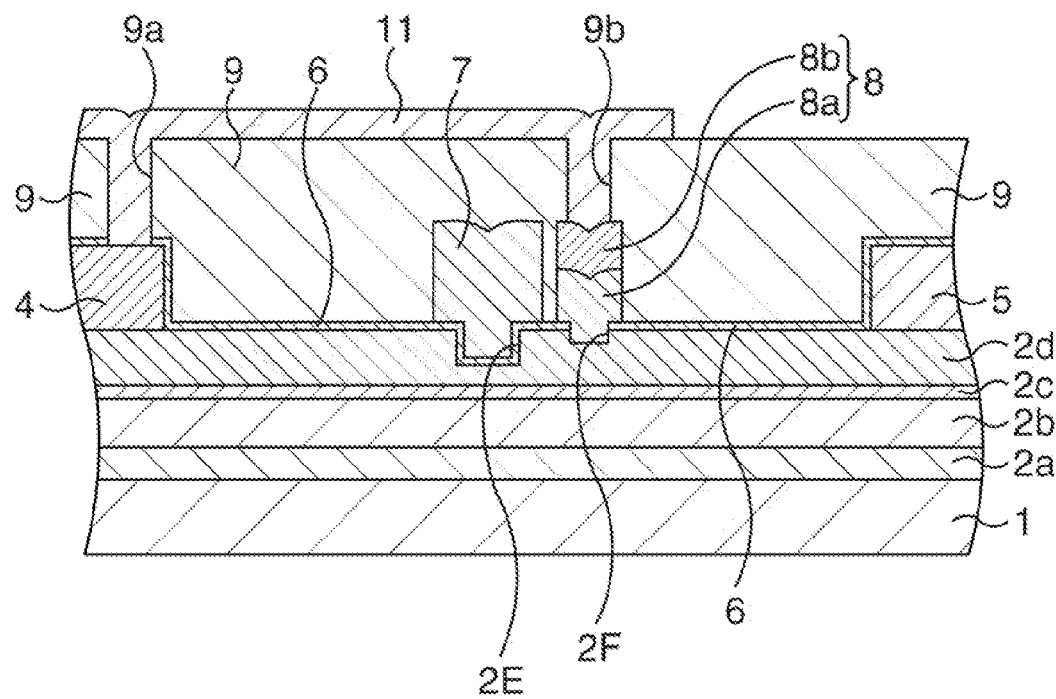
FIG. 10 is a schematic cross-sectional view illustrating an AlGaN/GaN HEMT according to another application example of the first embodiment.

Note that as another application example of the first embodiment, the cap layer 2*e* may not be formed in the structure of stacked compound semiconductors 2. FIG. 10 illustrates this AlGaN/GaN HEMT by way of example. Note that in FIG. 10, element isolation structures 3 are not illustrated.

Both an electrode recess 2E of the gate electrode 7 and a field plate recess 2F of the field plate 8 are formed by digging the recesses halfway through the electron supply layer 2*d* by dry etching.

Also in this application example, there is embodied a high-reliability high-voltage resistance AlGaN/GaN HEMT capable of improving the speed of device operation, being high in avalanche resistance, being resistant to surges, eliminating the need to connect any external diodes when applied to, for example, an inverter circuit, and achieving stable operation even if holes are produced, in addition to alleviating the concentration of electric fields on a gate electrode 7 and thereby realizing a further improvement in voltage resistance.

Modified Example 2

The present example discloses an AlGaN/GaN HEMT as in the case of the first embodiment. The modified example differs from the first embodiment, however, in the p-type semiconductor layer of a field plate. Note that the same components and the like as those of the first embodiment are denoted by like reference numerals and characters and will be described in no further detail here.

FIGS. 11 and 12 are schematic cross-sectional views illustrating main steps of a method for manufacturing the AlGaN/GaN HEMT according to Modified Example 2 of the first embodiment.

Figure 11A:
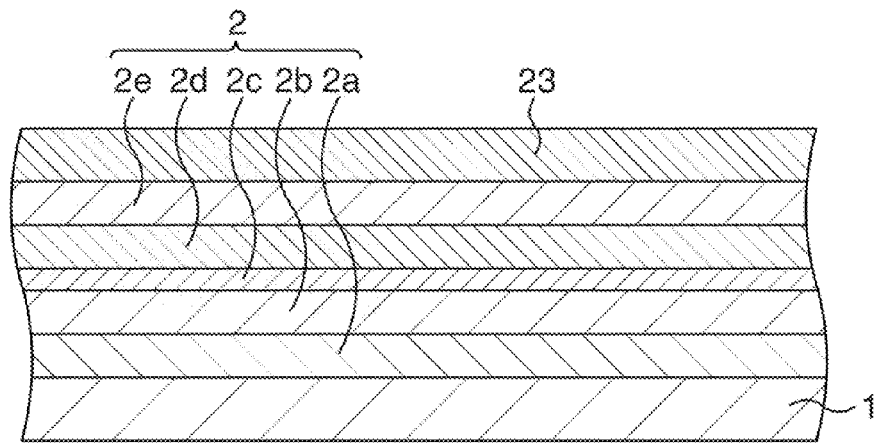
FIG. 11A to FIG. 11C are schematic cross-sectional views illustrating main steps of a method for manufacturing an AlGaN/GaN HEMT according to Modified Example 2 of the first embodiment.

First, as illustrated in FIG. 11A, a structure of stacked compound semiconductors 2 and a p-type semiconductor film 23 which is a semiconductor of a conductivity type opposite to a conductivity type that the structure of stacked compound semiconductors 2 has are formed on, for example, an Si substrate 1.

The structure of stacked compound semiconductors 2 includes a buffer layer 2*a*, an electron transit layer 2*b*, an intermediate layer 2*c*, an electron supply layer 2*d*, and a cap layer 2*e*.

On the Si substrate 1, AlN is grown to a thickness of approximately 0.1 μm, i-GaN is grown to a thickness of approximately 3 μm, i-AlGaN is grown to a thickness of approximately 5 nm, n-AlGaN is grown to a thickness of approximately 30 nm, n-GaN is grown to a thickness of approximately 10 nm, and p-GaN is grown to a thickness of approximately 10 nm, in the order mentioned, by using, for example, an MOVPE method. Consequently, there are formed the buffer layer 2*a*, the electron transit layer 2*b*, the intermediate layer 2*c*, the electron supply layer 2*d*, the cap layer 2*e*, and the p-type semiconductor film 23.

For the growth conditions of AlN, GaN, AlGaN and GaN, a mixed gas composed of a trimethyl aluminum gas, a trimethyl gallium gas and an ammonia gas is used as a raw material gas. Whether or not to supply the trimethyl aluminum gas which is an Al source and/or the trimethyl gallium gas which is a Ga source is determined and the flow rates of the gases are set, as appropriate, according to a compound semiconductor layer to be grown. The flow rate of the ammonia gas which is a common raw material is set to approximately 100 ccm to 10 LM. In addition, growth pressure is set to approximately 50 Torr to 300 Torr and growth temperature is set to approximately 1000° C. to 1200° C.

When GaN and AlGaN are grown as n-type semiconductors, an Si-containing SiH$_4$ gas, for example, is added as an n-type impurity to the raw material gas at a predetermined flow rate, so that GaN and AlGaN are doped with Si. The doping concentration of Si is set to approximately $1\times10^{18}$/cm$^3$ to $1\times10^{20}$/cm$^3$, for example, approximately $5\times10^{18}$/cm$^3$.

When GaN is grown as a p-type semiconductor, i.e., when p-GaN of the p-type semiconductor film 23 is grown, an Mg-containing bis-(cyclopentadienyl) magnesium gas, for example, is added as a p-type impurity to the raw material gas at a predetermined flow rate, thereby doping GaN with Mg. The doping concentration of Mg is set to approximately $1\times10^{16}$/cm$^3$ to $1\times10^{20}$/cm$^3$, for example, approximately $1\times10^{18}$/cm$^3$. As the p-type impurity, Ca or Sr may be used in place of Mg. In addition, a p-type impurity may be ion-implanted into grown i-GaN instead of doping the p-type impurity.

In the present example, p-GaN is formed as the p-type semiconductor film 23. Alternatively, another p-type nitride semiconductor, for example, p-type AlGaN, AlN, InN, InAlN, InAlGaN or the like may be formed in place of GaN. When InN, InAlN or InAlGaN is grown, a trimethyl indium gas, for example, is used as a raw material gas of In.

Figure 11B:
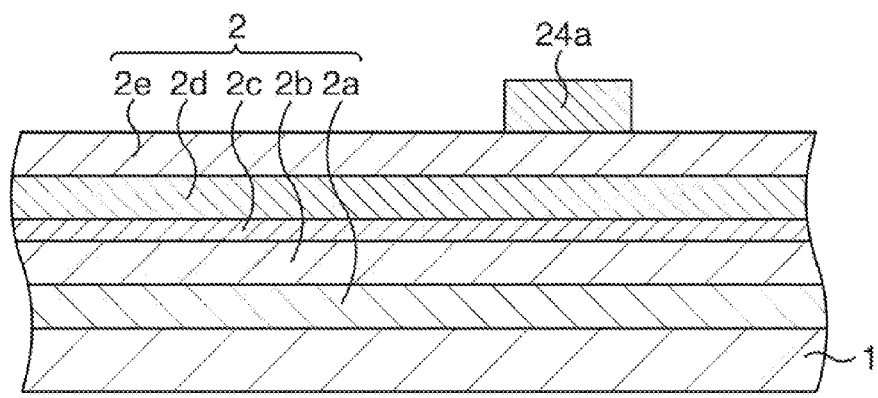

Subsequently, as illustrated in FIG. 11B, a p-type semiconductor layer 24a is formed.

Specifically, the p-type semiconductor film 23 is processed by means of lithography and dry etching, so as to remain only in a position on the structure of stacked compound semiconductors 2 in which a field plate is to be formed (position of an electrode scheduled to be formed therein). Consequently, the p-type semiconductor layer 24a is formed in the position of an electrode scheduled to be formed therein.

Subsequently, the same steps as those of FIGS. 1B to 2A in the first embodiment are carried out. At this time, an element isolation structure 3 is formed, a source electrode 4 and a drain electrode 5 are formed in electrode recesses 2A and 2B, and an electrode recess 2C is formed in the position of a gate electrode scheduled to be formed therein.

Figure 11C:
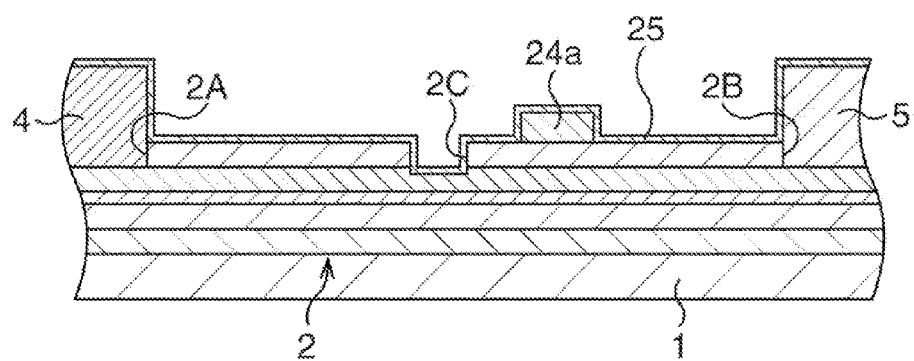

Subsequently, as illustrated in FIG. 11C, a gate insulation film 25 is formed.

Specifically, Al$_2$O$_3$, for example, is deposited as an insulating material on the structure of stacked compound semiconductors 2, so as to cover the inner wall surfaces of the electrode recess 2C and a surface portion of the p-type semiconductor layer 24a. Al$_2$O$_3$ is deposited by, for example, an atomic layer deposition method (ALD method) to a film thickness of approximately 2 nm to 200 nm, approximately 10 nm here. Consequently, there is formed the gate insulation film 25.

Note that Al$_2$O$_3$ may be deposited by, for example, a plasma CVD method or a sputtering method instead of the ALD method. A nitride or oxynitride of Al may be used and deposited instead of depositing Al$_2$O$_3$. In addition to the nitride and oxynitride of Al, an oxide, nitride or oxynitride of Si, Hf, Zr, Ti, Ta or W may be used. Alternatively, a selection may be made as appropriate from these oxides, nitrides or oxynitrides to deposit the selected material into a multilayer, thereby forming the gate insulation film.

The present embodiment discloses a so-called MIS-type AlGaN/GaN HEMT in which the gate insulation film 25 is provided between the gate electrode and the structure of stacked compound semiconductors 2. The present embodiment is not limited to this HEMT, however. Alternatively, there may be formed a so-called Schottky-type AlGaN/GaN HEMT in which the gate electrode is formed, without forming the gate insulation film 25, so as to directly have contact (Schottky contact) with the structure of stacked compound semiconductors.

Figure 12A:
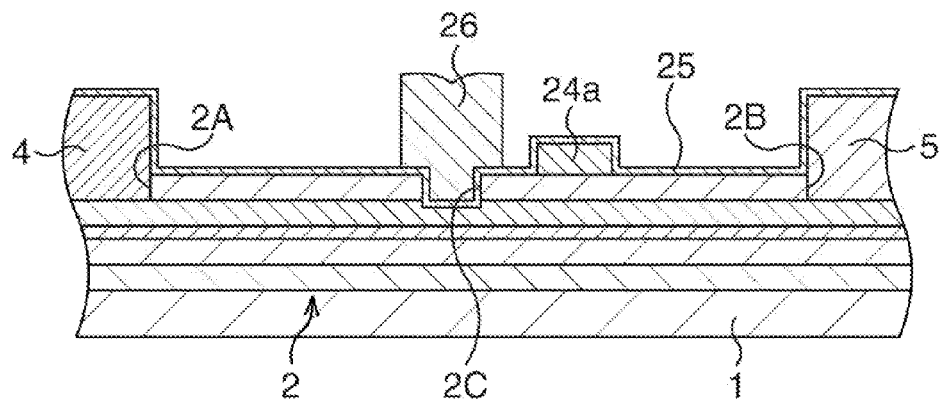
FIG. 12A to FIG. 12C are schematic cross-sectional views illustrating main steps of the method for manufacturing the AlGaN/GaN HEMT according to Modified Example 2 of the first embodiment following the steps of FIG. 11A to FIG. 11C.

Subsequently, as illustrated in FIG. 12A, a gate electrode 26 is formed.

Specifically, a resist mask for forming a gate electrode is first formed. Here, eaves-structured two-layer resist suited for an evaporation method and a liftoff method, for example, is used. This resist is coated on the gate insulation film 25 to form an opening to expose a portion of the gate insulation film 25 corresponding to the electrode recess 2C. Consequently, there is formed the resist mask having the abovementioned opening.

Using this resist mask, Ni and Au, for example, are deposited as electrode materials by, for example, an evaporation method on the resist mask, including the interior of the opening to expose a portion of the gate insulation film 25 corresponding to the electrode recess 2C. The thickness of Ni is set to approximately 30 nm, and the thickness of Au is set to approximately 400 nm. The resist mask and Ni and Au deposited thereon are removed by a liftoff method. Consequently, there is formed the gate electrode 26 in which the interior of the electrode recess 2C is filled with part of the electrode material through the gate insulation film 25.

Figure 12B:
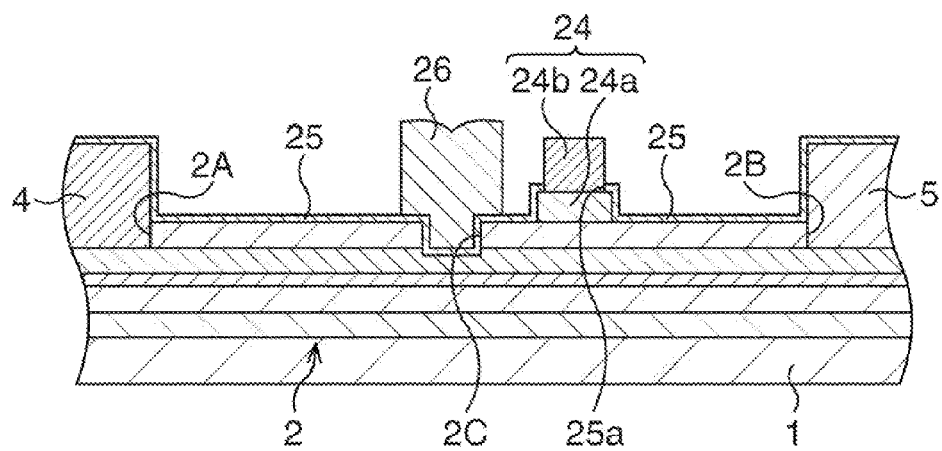

Subsequently, as illustrated in FIG. 12B, a connecting electrode 24b is formed on the p-type semiconductor layer 24a.

Specifically, first, the gate insulation film 25 is processed by means of lithography and dry etching. Consequently, there is formed, in the gate insulation film 25, an opening 25a to expose a surface portion of the p-type semiconductor layer 24a.

A resist mask for forming a connecting electrode is formed. Resist is coated on the entire surface of the HEMT being fabricated to form an opening to expose the p-type semiconductor layer 24a. Consequently, there is formed the resist mask having the abovementioned opening.

Using this resist mask, Ni and Au, for example, are deposited as electrode materials by, for example, an evaporation method on the resist mask, including the interior of the opening to expose an upper surface of a p-type semiconductor layer 24a. The thickness of Ni is set to approximately 30 nm, and the thickness of Au is set to approximately 400 nm. The resist mask and Ni and Au deposited thereon are removed by a liftoff method. Consequently, there is formed a connecting electrode 24b filling the opening 25a of the gate insulation film 25 and having ohmic contact with the exposed surface of the p-type semiconductor layer 24a. An electrode material of the connecting electrode 24b may be any conductive material, as long as the conductive material allows ohmic contact to be made with p-type semiconductors. Accordingly, Ti, Pd or Ta or an alloy thereof can be used in place of Ni and Au. In some cases, a conductive material that does not allow for ohmic contact can be applied, as long as the conductive material allows electrical connection to be made to p-type semiconductors.

Consequently, there is formed a field plate 24 composed of the p-type semiconductor layer 24a and the connecting electrode 24b. In the field plate 24, the p-type semiconductor layer 24a thereof directly has contact with the cap layer 2e of the structure of the stacked compound semiconductor 2.

The field plate 24 may be formed into a shape biased in a direction not facing the adjacent gate electrode 7, i.e., toward the drain electrode 5, as in the case of FIG. 5 in the first embodiment. Specifically, a portion of the field plate 24 on the drain electrode 5 side is extendedly formed on the gate insulation film 25. In an AlGaN/GaN HEMT, a larger voltage may be applied, in some cases, to a drain electrode than to a source electrode and a gate electrode. Even in these cases, adopting this configuration enables the field plate 24 to alleviate electric fields generated due to the application of a large voltage.

Figure 12C:
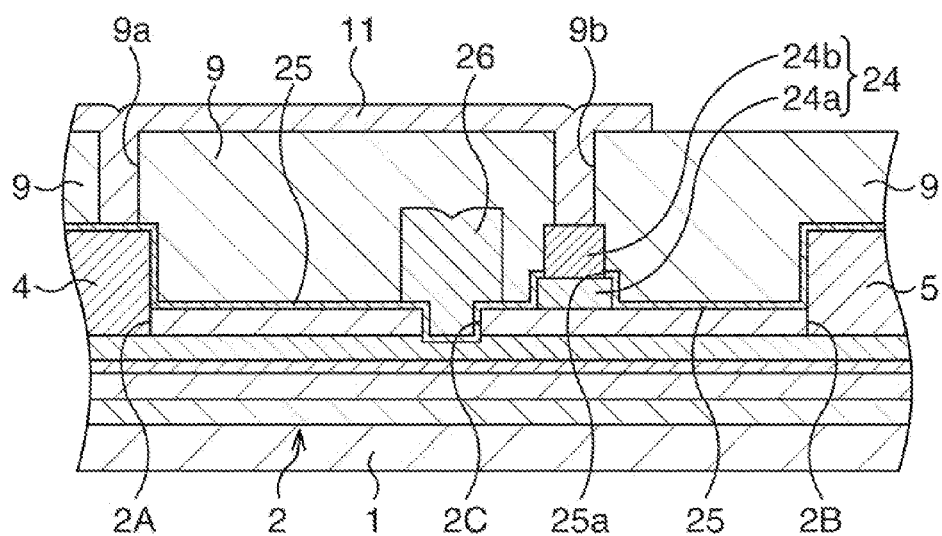

Subsequently, the same steps as those of FIGS. 4A and 4B in the first embodiment are carried out. Consequently, the source electrode 4 and the connecting electrode 24b of the field plate 24 are electrically connected to each other by an interconnect layer 11. FIG. 12C illustrates how the HEMT at this stage is viewed.

Thereafter, the AlGaN/GaN HEMT according to the present example is formed after being made to go through steps, including a step of forming an upper-layer protective film.

In the AlGaN/GaN HEMT according to the present example, the gate electrode 26 is formed so as to fill the electrode recess 2C through the gate insulation film 25. High-voltage resistance normally-off operation required of HEMTs is made possible by adopting this MIS-type recess gate structure as a premise.

In the present example, the field plate 24 is provided so as to be adjacent to the gate electrode 26 on the drain electrode 5 side thereof. The field plate 24 has, in the lower portion thereof, the p-type semiconductor layer 24a. This p-type semiconductor layer 24a becomes depleted for reasons of relation with the n-type semiconductor of the structure of the stacked compound semiconductor 2. Thus, a depletion layer extends and expands under the p-type semiconductor layer 24a. Consequently, voltage resistance is significantly improved. In addition, parasitic capacitances Cds and Cgd are greatly reduced due to the extension of the depletion layer caused by the p-type semiconductor layer 24a. Thereby, the increased speed of device operation is realized.

Yet additionally, in the present example, a pn junction is formed between p-GaN of the p-type semiconductor layer 24a and n-GaN of the cap layer 2e by adopting the field plate 24 in which the structure of stacked compound semiconductors 2 and the p-type semiconductor layer 24a directly have contact with each other. Consequently, there is imparted the function of a protective diode in which the field plate 24 serves as an anode and the drain electrode 5 serves as a cathode. Accordingly, even if a surge voltage arises in the AlGaN/GaN HEMT, the AlGaN/GaN HEMT is prevented from breakdown by the commutating action of the protective diode. As described above, the present embodiment ensures adequate avalanche resistance and contributes to stabilizing device operation.

As has been described heretofore, according to the present embodiment, there is embodied a high-reliability high-voltage resistance AlGaN/GaN HEMT capable of improving the speed of device operation, being high in avalanche resistance, being resistant to surges, eliminating the need to connect any external diodes when applied to, for example, an inverter circuit, and achieving stable operation even if holes are produced, in addition to alleviating the concentration of electric fields on the gate electrode 26 and thereby realizing a further improvement in voltage resistance.

Second Embodiment

The present embodiment discloses an AlGaN/GaN HEMT as in the case of the first embodiment. The present embodiment differs from the first embodiment, however, in that an insulation layer is formed between a structure of stacked compound semiconductors and a field plate. Note that the same components and the like as those of the first embodiment are denoted by like reference numerals and characters and will be described in no further detail here.

FIGS. 13 and 14 are schematic cross-sectional views illustrating main steps of a method for manufacturing the AlGaN/GaN HEMT according to the second embodiment.

First, the same steps as those of FIGS. 1A to 2A in the first embodiment are carried out.

At this time, a source electrode 4 and a drain electrode 5 are formed in electrode recesses 2A and 2B of the structure of stacked compound semiconductors 2 and an electrode recess 2C for a gate electrode is formed in the structure of stacked compound semiconductors 2.

Figure 13A:
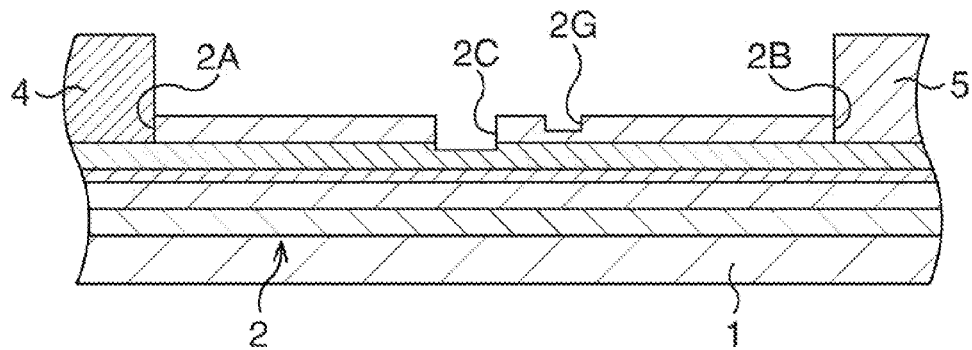
FIG. 13A to 13C are schematic cross-sectional views illustrating main steps of a method for manufacturing an AlGaN/GaN HEMT according to a second embodiment.

Subsequently, as illustrated in FIG. 13A, a field plate recess 2G is formed in the structure of stacked compound semiconductors 2.

Specifically, first, resist is coated on the structure of stacked compound semiconductors 2. The resist is processed by means of lithography, so that an opening to expose a surface portion of the cap layer 2e corresponding to a position in which a field plate is to be formed (position of an electrode scheduled to be formed therein) is formed in the resist. Consequently, there is formed a resist mask having the abovementioned opening. Note that this position of an electrode scheduled to be formed therein is defined as a predetermined location between the electrode recess 2C of the gate electrode and the drain electrode 5.

Using this resist mask, a portion of the cap layer 2e in the position of an electrode scheduled to be formed therein is removed by dry etching. Consequently, there is formed the field plate recess 2G dug through to part of the cap layer 2e. The field plate recess 2G is formed so that the longitudinal direction thereof is parallel along the longitudinal direction of the electrode recess 2C. For etching conditions, an inert gas such as Ar and a chlorine-based gas such as $Cl_2$ are used as etching gases and, for example, $Cl_2$ is set to have a flow rate of 30 sccm, pressure is set to 2 Pa, and RF input power is set to 20 W.

The resist mask is removed by asking treatment or the like.

Figure 13B:
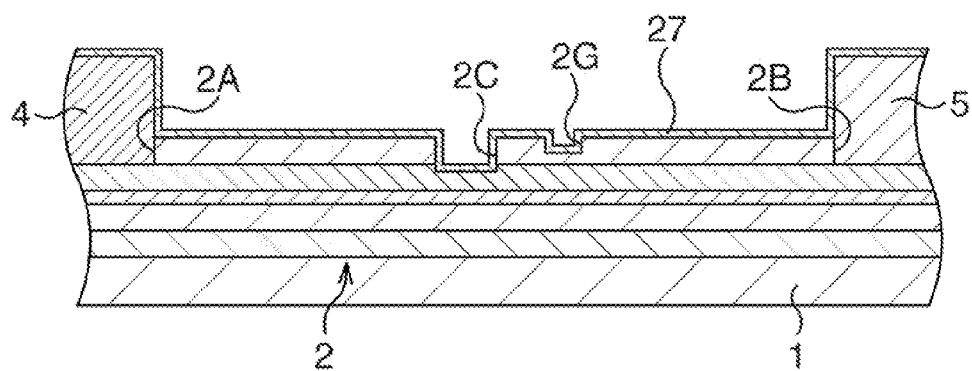

Subsequently, as illustrated in FIG. 13B, a gate insulation film 27 is formed.

Specifically, $Al_2O_3$, for example, is deposited as an insulating material on the structure of stacked compound semiconductors 2, so as to cover the inner wall surfaces of the electrode recesses 2C and 2G. $Al_2O_3$ is deposited by, for example, an atomic layer deposition method (ALD method) to a film thickness of approximately 2 nm to 200 nm, approximately 10 nm here. Consequently, there is formed the gate insulation film 27.

Note that $Al_2O_3$ may be deposited by, for example, a plasma CVD method or a sputtering method instead of the ALD method. A nitride or oxynitride of Al may be used and deposited instead of depositing $Al_2O_3$. In addition to the nitride and oxynitride of Al, an oxide, nitride or oxynitride of Si, Hf, Zr, Ti, Ta or W may be used. Alternatively, a selection may be made as appropriate from these oxides, nitrides or oxynitrides to deposit the selected material into a multilayer, thereby forming the gate insulation film.

Figure 13C:
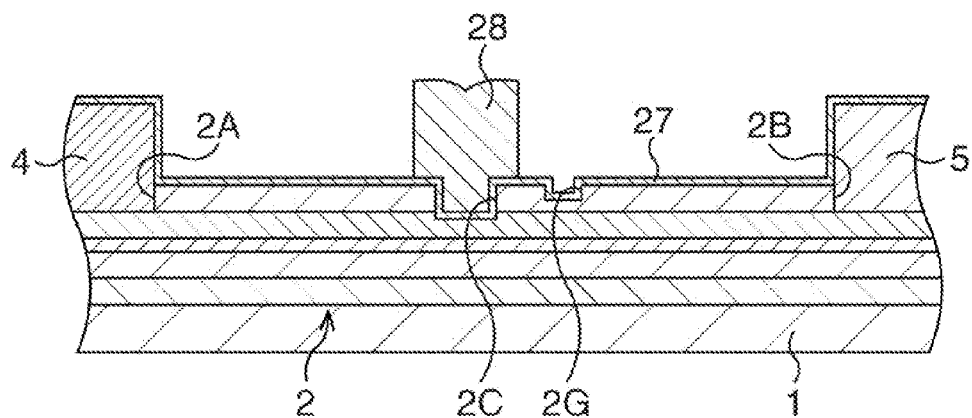

Subsequently, as illustrated in FIG. 13C, a gate electrode 28 is formed.

Specifically, first, a resist mask for forming a gate electrode is formed. Here, eaves-structured two-layer resist suited for an evaporation method and a liftoff method, for example, is used. This resist is coated on the gate insulation film 27 to form an opening to expose a portion of the gate insulation film 27 corresponding to the electrode recess 2C. Consequently, there is formed the resist mask having the abovementioned opening.

Using this resist mask, Ni and Au, for example, are deposited as electrode materials by, for example, an evaporation method on the resist mask, including the interior of the opening to expose a portion of the gate insulation film 27 corresponding to the electrode recess 2C. The thickness of Ni is set to approximately 30 nm, and the thickness of Au is set to approximately 400 nm. The resist mask and Ni and Au deposited thereon are removed by a liftoff method. Consequently, there is formed the gate electrode 28 in which the interior of the electrode recess 2C is filled with part of the electrode material through the gate insulation film 27.

Figure 14A:
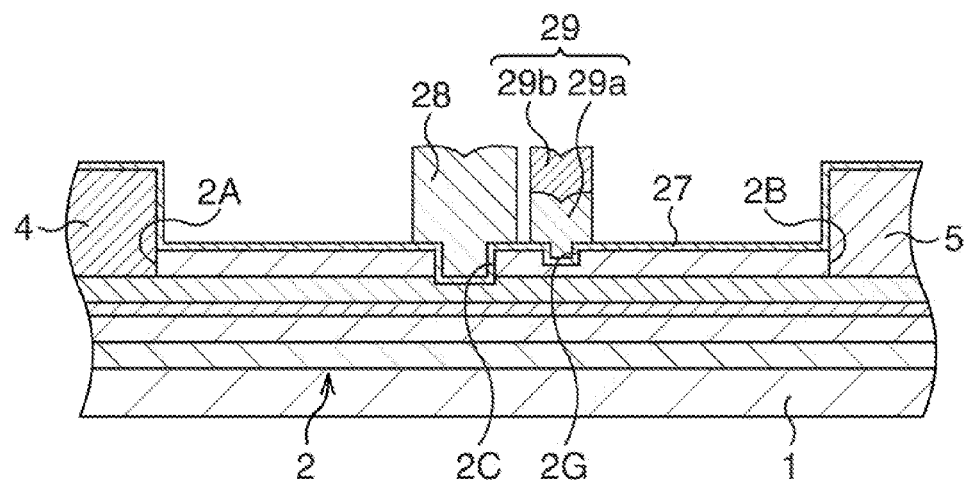
FIG. 14A and FIG. 14B are schematic cross-sectional views illustrating main steps of the method for manufacturing the AlGaN/GaN HEMT according to the second embodiment following the steps of FIG. 13A to FIG. 13C.

Subsequently, as illustrated in FIG. 14A, a field plate 29 is formed.

Specifically, first, a conductive oxide which, when formed, exhibits the properties of a p-type semiconductor is deposited here by, for example, a sputtering method on the entire surface of the HEMT being fabricated, including the interior of the field plate recess 2G through the gate insulation film 27, as a semiconductor of a conductivity type opposite to a conductivity type that the structure of the stacked compound semiconductors 2 has, i.e., as a p-type semiconductor. As this conductive oxide, one or a plurality of materials selected from the group consisting of NiO, $FeO_2$, $CoO_2$, MnO, CuO, ZnO, $In_2O_3$, $SnO_2$, $Y_2O_3$, $SrTiO_3$, $SrPbO_3$ and $TiO_2$ is used. Here, a case is shown by way of example in which NiO is used.

Instead of depositing this conductive oxide, p-type Si may be deposited by, for example, a CVD method. In this case, Si is doped with a p-type impurity (such as boron (B)) and then deposited, or the p-type impurity is ion-implanted into Si after the deposition of Si.

The deposited NiO is processed by means of lithography and dry etching, so as to remain in a position in which a field plate is to be formed, including the interior of the field plate recess 2G through the gate insulation film 27. Consequently, there is formed a p-type semiconductor layer 29a in which the interior of the field plate recess 2G is filled with part of NiO through the gate insulation film 27.

Next, a connecting electrode 29b is formed on the p-type semiconductor layer 29a.

First, a resist mask for forming the connecting electrode is formed. Resist is coated on the entire surface of the HEMT being fabricated to form an opening to expose the p-type semiconductor layer 29a. Consequently, there is formed the resist mask having the abovementioned opening.

Using this resist mask, Ni and Au, for example, are deposited as electrode materials by, for example, an evaporation method on the resist mask, including the interior of the opening to expose an upper surface of the p-type semiconductor layer 29a. The thickness of Ni is set to approximately 30 nm, and the thickness of Au is set to approximately 400 nm. The resist mask and Ni and Au deposited thereon are removed by a liftoff method. Consequently, there is formed, on the p-type semiconductor layer 29a, the connecting electrode 29b having ohmic contact therewith. An electrode material of the connecting electrode 29b may be any conductive material, as along as the conductive material allows ohmic contact to be made with p-type semiconductors. Accordingly, Ti, Pd or Ta or an alloy thereof can be used in place of Ni and Au. In some cases, a conductive material that does not allow for ohmic contact can be applied, as long as the conductive material allows electrical connection to be made to p-type semiconductors.

Consequently, there is formed a field plate 29b composed of the p-type semiconductor layer 29a and the connecting electrode 29b. In the field plate 29, the p-type semiconductor layer 29a thereof is laid out within the cap layer 2e of the structure of stacked compound semiconductors 2 and the field plate recess 2G through the gate insulation film 27.

The field plate 29 may be formed into a shape biased in a direction not facing the adjacent gate electrode 28, i.e., toward the drain electrode 5, as in the case of FIG. 5 in the first embodiment. Specifically, a portion of the field plate 29 on the drain electrode 5 side is extendedly formed on the gate insulation film 27. In an AlGaN/GaN HEMT, a larger voltage may be applied, in some cases, to a drain electrode than to a source electrode and a gate electrode. Even in these cases, adopting this configuration enables the field plate 29 to alleviate electric fields generated due to the application of a large voltage.

Figure 14B:
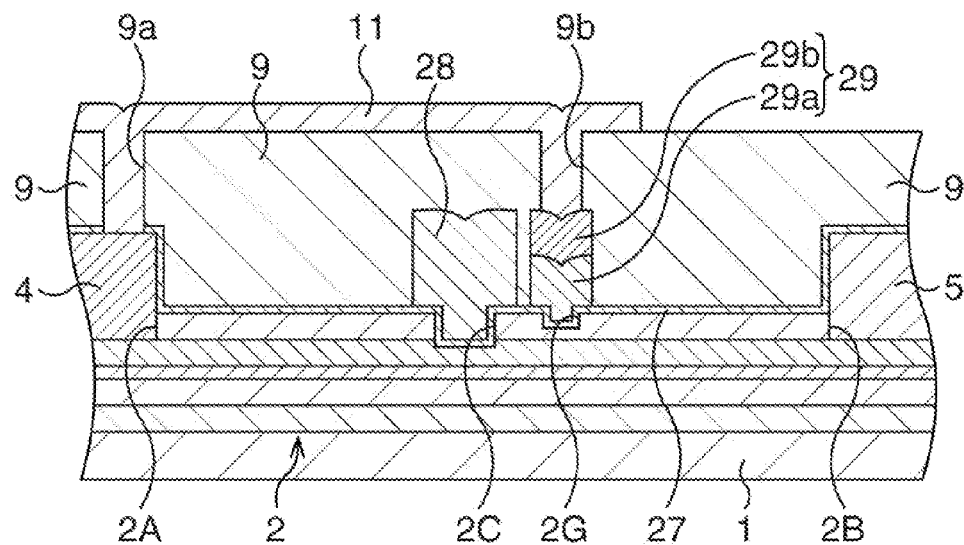

Subsequently, the same steps as those of FIGS. 4A and 4B in the first embodiment are carried out. Consequently, the source electrode 4 and the field plate 29 are electrically connected to each other by an interconnect layer 11. FIG. 14B illustrates how the HEMT at this stage is viewed.

Thereafter, the AlGaN/GaN HEMT according to the present embodiment is formed after being made to go through steps, including a step of forming an upper-layer protective film.

In the AlGaN/GaN HEMT according to the present embodiment, the gate electrode 28 is formed so as to fill the electrode recess 2C through the gate insulation film 27. High-voltage resistance normally-off operation required of HEMTs is made possible by adopting this MIS-type recess gate structure as a premise.

In the present embodiment, the field plate 29 for filling the field plate recess 2G through the gate insulation film 27 is provided so as to be adjacent to the gate electrode 28 on the drain electrode 5 side thereof. The field plate 29 has, in the lower portion thereof, the p-type semiconductor layer 29a. This p-type semiconductor layer 29a becomes depleted for reasons of relation with the n-type semiconductor of the structure of the stacked compound semiconductors 2. Thus, a depletion layer extends and expands under the p-type semiconductor layer 29a. Consequently, electric fields applied to an edge portion of the gate electrode 28 are sufficiently alleviated by adopting a recess structure. In addition, voltage resistance is further improved due to the extension of the depletion layer. Yet additionally, parasitic capacitances Cds and Cgd are greatly reduced due to the extension of the depletion layer caused by the p-type semiconductor layer 29a. Thereby, the increased speed of device operation is realized. The presence of the gate insulation film 27 underneath the field plate 29 further reduces the capacitances, thereby facilitating an increase in the speed of device operation.

As has been described heretofore, according to the present embodiment, there is embodied a high-reliability high-voltage resistance AlGaN/GaN HEMT capable of further improving the speed of device operation and achieving stable operation even if holes are produced, in addition to alleviating the concentration of electric fields on a gate electrode 28 and thereby realizing a further improvement in voltage resistance.

Note that also in the present embodiment, the cap layer of the structure of stacked compound semiconductors may have a three-layer structure composed of n-GaN, AlN and n-GaN, as in Modified Example 1 of the first embodiment. Alternatively, the AlGaN/GaN HEMT may have a configuration including no cap layers.

Modified Example

Hereinafter, a description will be given of a modified example of the AlGaN/GaN HEMT according to the second embodiment.

The present example discloses an AlGaN/GaN HEMT as in the case of the second embodiment. The modified example differs from the second embodiment, however, in the p-type semiconductor layer of the field plate. Note that the same components and the like as those of the second embodiment are denoted by like reference numerals and characters and will be described in no further detail here.

Figure 15A:
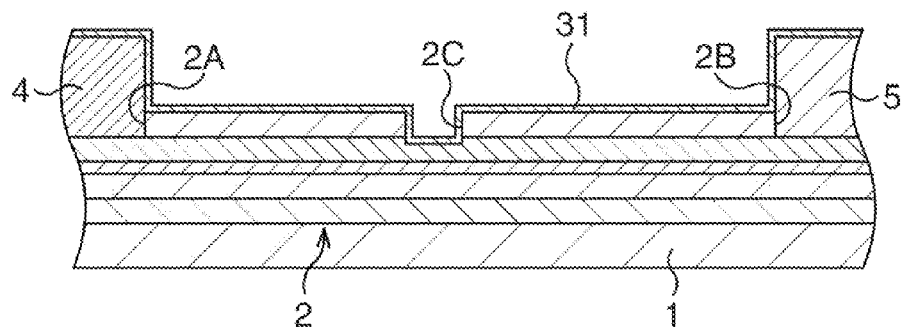
FIG. 15A to FIG. 15C are schematic cross-sectional views illustrating main steps of a method for manufacturing an AlGaN/GaN HEMT according to a modified example of the second embodiment.
Figure 16A:
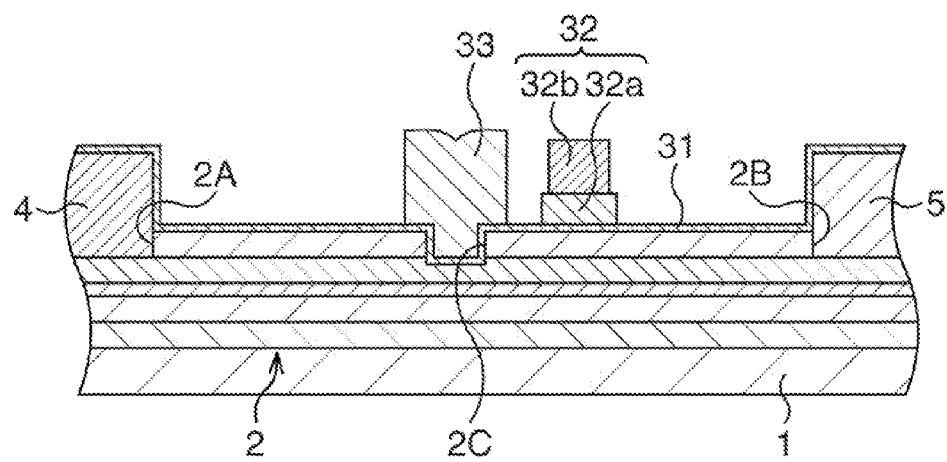
FIG. 16A and FIG. 16B are schematic cross-sectional views illustrating main steps of the method for manufacturing the AlGaN/GaN HEMT according to the modified example of the second embodiment following the steps of FIG. 15A to FIG. 15C.
Figure 16B:
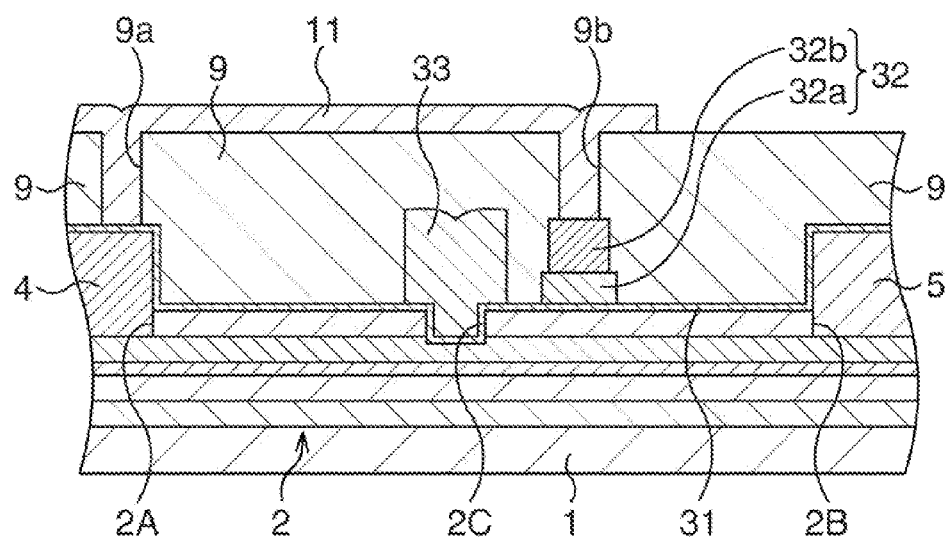

FIGS. 15A and 16B are schematic cross-sectional views illustrating main steps of a method for manufacturing the AlGaN/GaN HEMT according to the modified example of the second embodiment.

First, the same steps as those of FIGS. 1A to 2A in the first embodiment are carried out.

At this time, a source electrode 4 and a drain electrode 5 are formed in electrode recesses 2A and 2B of a structure of stacked compound semiconductors 2 and an electrode recess 2C for a gate electrode is formed in the structure of stacked compound semiconductors 2.

Subsequently, as illustrated in FIG. 15A, a gate insulation film 31 is formed.

Specifically, $Al_2O_3$, for example, is deposited as an insulating material on the structure of stacked compound semiconductors 2, so as to cover the inner wall surfaces of the electrode recess 2C. $Al_2O_3$ is deposited by, for example, an atomic layer deposition method (ALD method) to a film thickness of approximately 2 nm to 200 nm, approximately 10 nm here. Consequently, there is formed the gate insulation film 31.

Note that $Al_2O_3$ may be deposited by, for example, a plasma CVD method or a sputtering method instead of the ALD method. A nitride or oxynitride of Al may be used and deposited instead of depositing $Al_2O_3$. In addition to the nitride and oxynitride of Al, an oxide, nitride or oxynitride of Si, Hf, Zr, Ti Ta or W may be used. Alternatively, a selection may be made as appropriate from these oxides, nitrides or oxynitrides to deposit the selected material into a multilayer, thereby forming the gate insulation film.

Figure 15B:
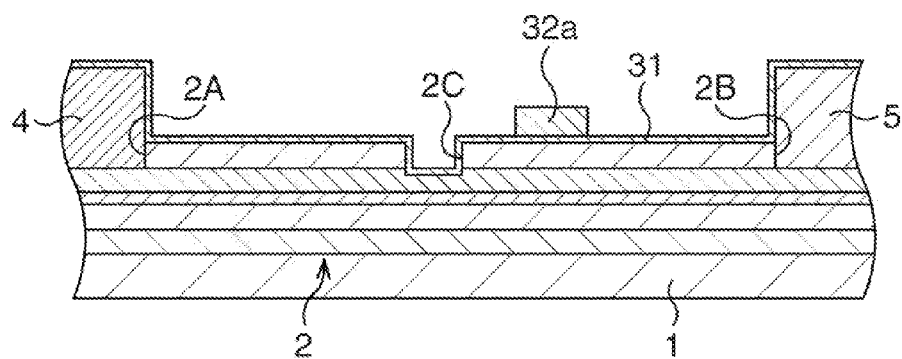

Subsequently, as illustrated in FIG. 15B, there is formed a p-type semiconductor layer 32a which is a semiconductor of a conductivity type opposite to a conductivity type that the structure of stacked compound semiconductors 2 has.

Specifically, first, a p-type semiconductor film is formed on the gate insulation film 31. More specifically, p-GaN is grown on the gate insulation film 31 by an MOVPE method or the like to a thickness of approximately 50 nm. Consequently, there is formed the p-type semiconductor film. When p-GaN is grown, an Mg-containing bis-(cyclopentadienyl) magnesium gas, for example, is added as a p-type impurity to a raw material gas at a predetermined flow rate, so that GaN is doped with Mg. The doping concentration of Mg is set to approximately $1 \times 10^{16}/cm^3$ to $1 \times 10^{20}/cm^3$, for example, approximately $1 \times 10^{18}/cm^3$. As the p-type impurity, Ca or Sr may be used in place of Mg. In addition, the p-type impurity may be ion-implanted into grown i-GaN instead of doping the p-type impurity.

In the present example, p-GaN is formed as the p-type semiconductor film. Alternatively, another p-type nitride semiconductor, for example, p-type AlGaN, AlN, InN, InAlN, InAlGaN or the like may be formed in place of GaN. When InN, InAlN or InAlGaN is grown, a trimethyl indium gas, for example, is used as a raw material gas of In.

The p-type semiconductor film is processed by means of lithography and dry etching, so as to remain only in a position on the gate insulation film 31 in which a field plate is to be formed (position of an electrode scheduled to be formed therein). Consequently, the p-type semiconductor layer 32a is formed in the position of an electrode scheduled to be formed therein.

Figure 15C:
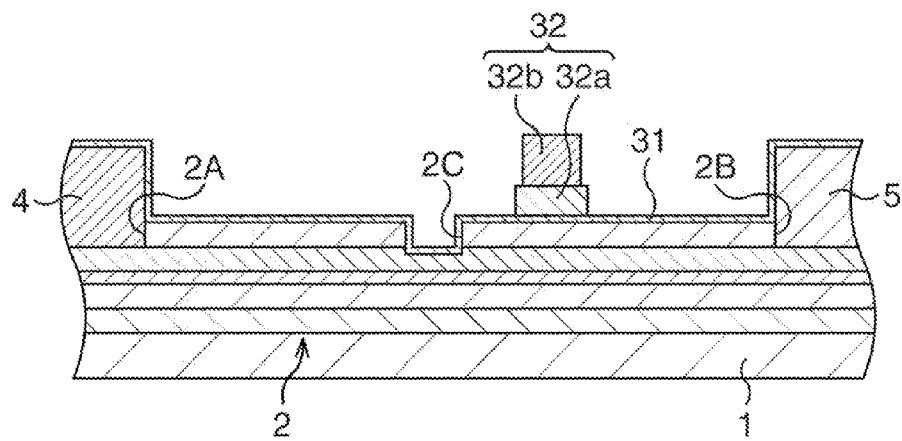

Subsequently, a connecting electrode 32b is formed on the p-type semiconductor layer 32a, as illustrated in FIG. 15C.

Specifically, first, a resist mask for forming the connecting electrode is formed. Resist is coated on the entire surface of the HEMT being fabricated to form an opening to expose the p-type semiconductor layer 32a. Consequently, there is formed the resist mask having the abovementioned opening.

Using this resist mask, Ni and Au, for example, are deposited as electrode materials by, for example, an evaporation method on the resist mask, including the interior of the opening to expose an upper surface of the p-type semiconductor layer 32a. The thickness of Ni is set to approximately 30 nm, and the thickness of Au is set to approximately 400 nm. The resist mask and Ni and Au deposited thereon are removed by a liftoff method. Consequently, there is formed the connecting electrode 32b having ohmic contact with the exposed surface of the p-type semiconductor layer 32a. An electrode material of the connecting electrode 32b may be any conductive material, as along as the conductive material allows ohmic contact to be made with p-type semiconductors. Accordingly, Ti, Pd or Ta or an alloy thereof can be used in place of Ni and Au. In some cases, a conductive material that does not allow for ohmic contact can be applied, as long as the conductive material allows electrical connection to be made to p-type semiconductors.

Consequently, there is formed a field plate 32 composed of the p-type semiconductor layer 32a and the connecting electrode 32b. In the field plate 32, the p-type semiconductor layer 32a thereof is laid out through the cap layer 2e of the structure of stacked compound semiconductors 2 and the gate insulation film 31.

The field plate 32 may be formed into a shape biased in a direction not facing the adjacent gate electrode, i.e., toward the drain electrode 5, as in the case of FIG. 5 in the first embodiment. Specifically, a portion of the field plate 32 on the drain electrode 5 side is extendedly formed on the gate insulation film 31. In an AlGaN/GaN HEMT, a larger voltage may be applied, in some cases, to a drain electrode than to a source electrode and a gate electrode. Even in these cases, adopting this configuration enables the field plate 32 to alleviate electric fields generated due to the application of a large voltage.

Subsequently, as illustrated in FIG. 16A, a gate electrode 33 is formed.

Specifically, first, a resist mask for forming a gate electrode is formed. Here, eaves-structured two-layer resist suited for an evaporation method and a liftoff method, for example, is used. This resist is coated on the gate insulation film 31 to form an opening to expose the electrode recess 2C. Consequently, the resist mask having the abovementioned opening is formed.

Using this resist mask, Ni and Au, for example, are deposited as electrode materials by, for example, an evaporation method on the resist mask, including the interior of the opening to expose the electrode recess 2C of the gate insulation film 31. The thickness of Ni is set to approximately 30 nm, and the thickness of Au is set to approximately 400 nm. The resist mask and Ni and Au deposited thereon are removed by a liftoff method. Consequently, there is formed the gate electrode 33 in which the interior of the electrode recess 2C is filled with part of the electrode material through the gate insulation film 31.

Subsequently, the same steps as those of FIGS. 4A and 4B in the first embodiment are carried out. Consequently, the source electrode 4 and the field plate 32 are electrically connected to each other by an interconnect layer 11. FIG. 16B illustrates how the HEMT at this stage is viewed.

Thereafter, the AlGaN/GaN HEMT according to the present embodiment is formed after being made to go though steps, including a step of forming an upper-layer protective film.

In the AlGaN/GaN HEMT according to the present example, the gate electrode 33 is formed so as to fill the electrode recess 2C through the gate insulation film 27. High-voltage resistance normally-off operation required of HEMTs is made possible by adopting this MIS-type recess gate structure as a premise.

In the present example, the field plate 32 is provided on the structure of stacked compound semiconductors 2 through the gate insulation film 31, so as to be adjacent to the gate electrode 33 on the drain electrode 5 side thereof. The field plate 32 has, in the lower portion thereof, the p-type semiconductor layer 32a. This p-type semiconductor layer 32a becomes depleted for reasons of relation with the n-type semiconductor of the structure of the stacked compound semiconductor 2. Thus, a depletion layer extends and expands under the p-type semiconductor layer 32a. Consequently, voltage resistance is improved. In addition, parasitic capacitances Cds and Cgd are greatly reduced due to the extension of the depletion layer caused by the p-type semiconductor layer 32a. Thereby, the increased speed of device operation is realized. The presence of the gate insulation film 31 underneath the field plate 32 further reduces the capacitances, thereby facilitating an increase in the speed of device operation.

As has been described heretofore, according to the present example, there is embodied a high-reliability high-voltage resistance AlGaN/GaN HEMT capable of further improving the speed of device operation and achieving stable operation even if holes are produced, in addition to alleviating the concentration of electric fields on the gate electrode 33 and thereby realizing a further improvement in voltage resistance.

Note that although in the above-described first and second embodiments and the modified examples thereof, AlGaN/GaN HEMTs having a gate recess structure have been disclosed, the embodiments and the modified examples are not limited to these HEMTs. Alternatively, a gate electrode may be formed on a gate insulation film or on a structure of stacked compound semiconductors without forming an electrode recess for the gate electrode.

The AlGaN/GaN HEMTs according to the above-described first and second embodiments and the modified examples thereof are applied to a so-called discrete package.

In this discrete package, a chip of any one of the above-described AlGaN/GaN HEMTs is mounted. Hereinafter, a discrete package for a chip of an AlGaN/GaN HEMT according to any one of the above-described first and second embodiments and the modified examples thereof (hereinafter referred to as an HEMT chip) will be described by way of example.

Figure 17:
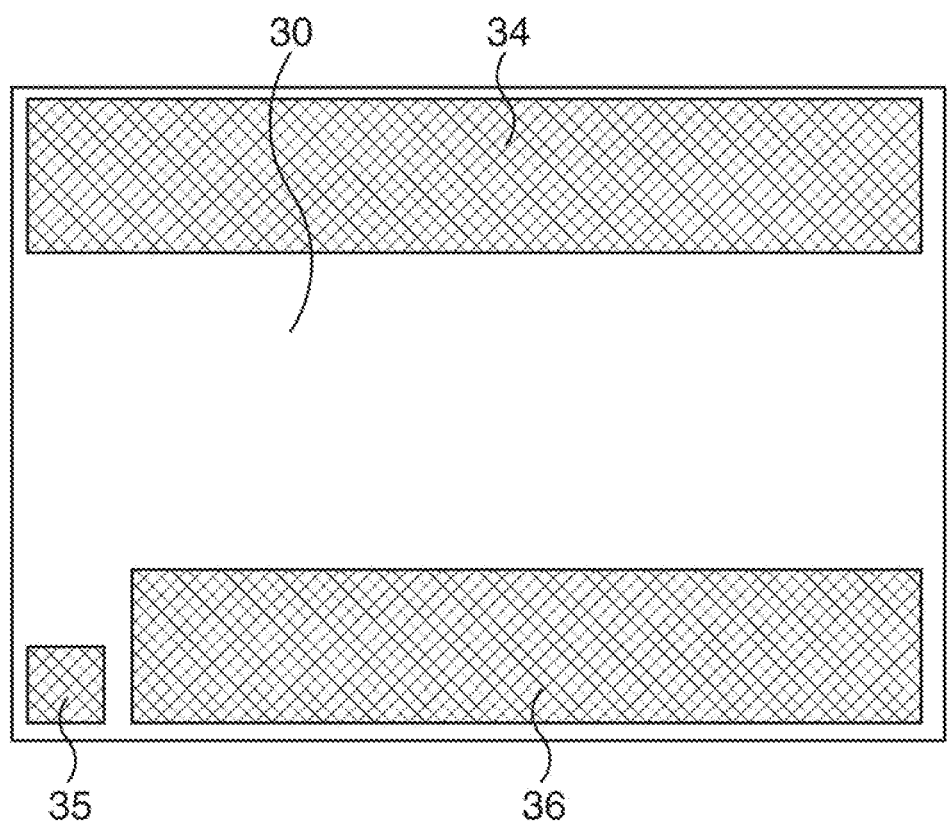
FIG. 17 is a plan view illustrating a schematic configuration of an HEMT chip of an MIS-type AlGaN/GaN HEMT according to the first and second embodiments and the modified examples thereof.

FIG. 17 illustrates a schematic configuration of the HEMT chip.

In an HEMT chip 30, a drain pad 34 to which the drain electrode of the above-described AlGaN/GaN HEMT is connected, a gate pad 35 to which the gate electrode of the HEMT is connected, and a source pad 36 to which the source electrode of the HEMT is connected are disposed on a surface of the HEMT chip.

Figure 18:
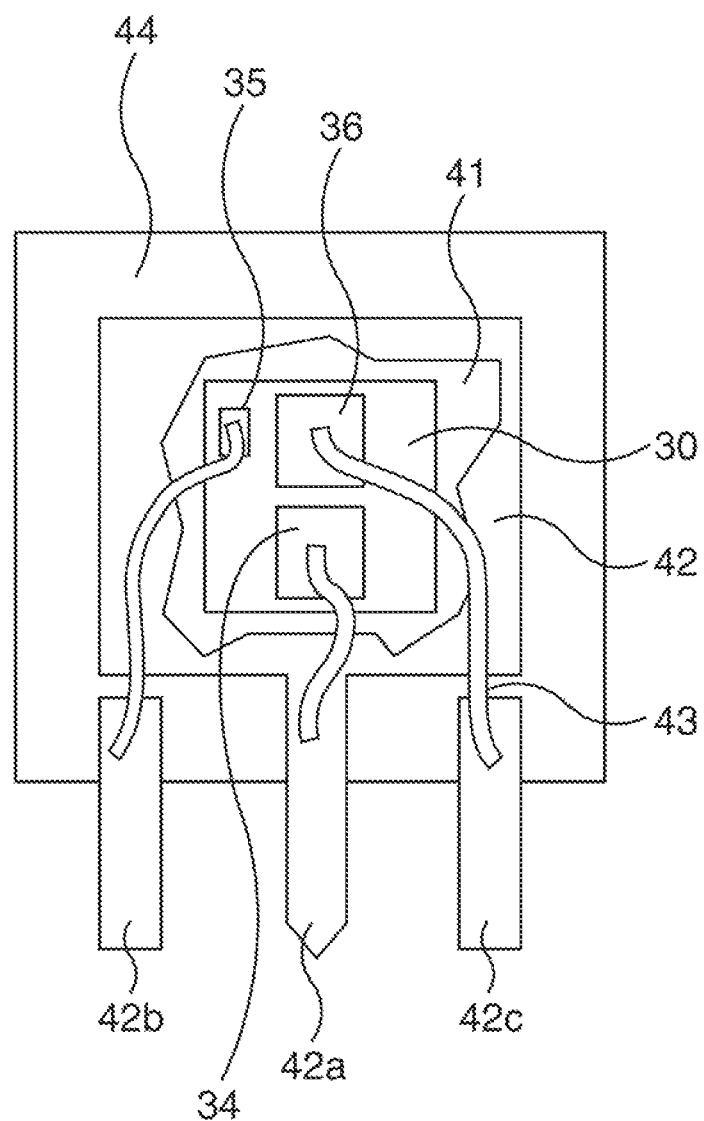
FIG. 18 is a plan view illustrating a schematic configuration of a discrete package using an HEMT chip according to the first and second embodiments and the modified examples thereof.

FIG. 18 is a schematic plan view illustrating the discrete package.

In order to fabricate the discrete package, first, the HEMT chip 30 is fixed to a lead frame 42 by using a die attach agent 41, such as solder. A drain lead 42a is formed in the lead frame 42 integrally therewith, and a gate lead 42b and a source lead 42c are disposed at a distance from the lead frame 42 as separate components.

Subsequently, the drain pad 34 and the drain lead 42a, the gate pad 35 and the gate lead 42b, and the source pad 36 and the source lead 42c are electrically connected to each other, respectively, by means of bonding using an Al wire 43.

Thereafter, the HEMT chip 30 is resin-sealed by a transfer molding method using a molding resin 44, and the lead frame 42 is separated from the molding resin 44. Consequently, there is formed the discrete package.

Third Embodiment

The present embodiment discloses a PFC (Power Factor Correction) circuit provided with an AlGaN/GaN HEMT selected from those of the first and second embodiments and the modified examples thereof.

Figure 19:
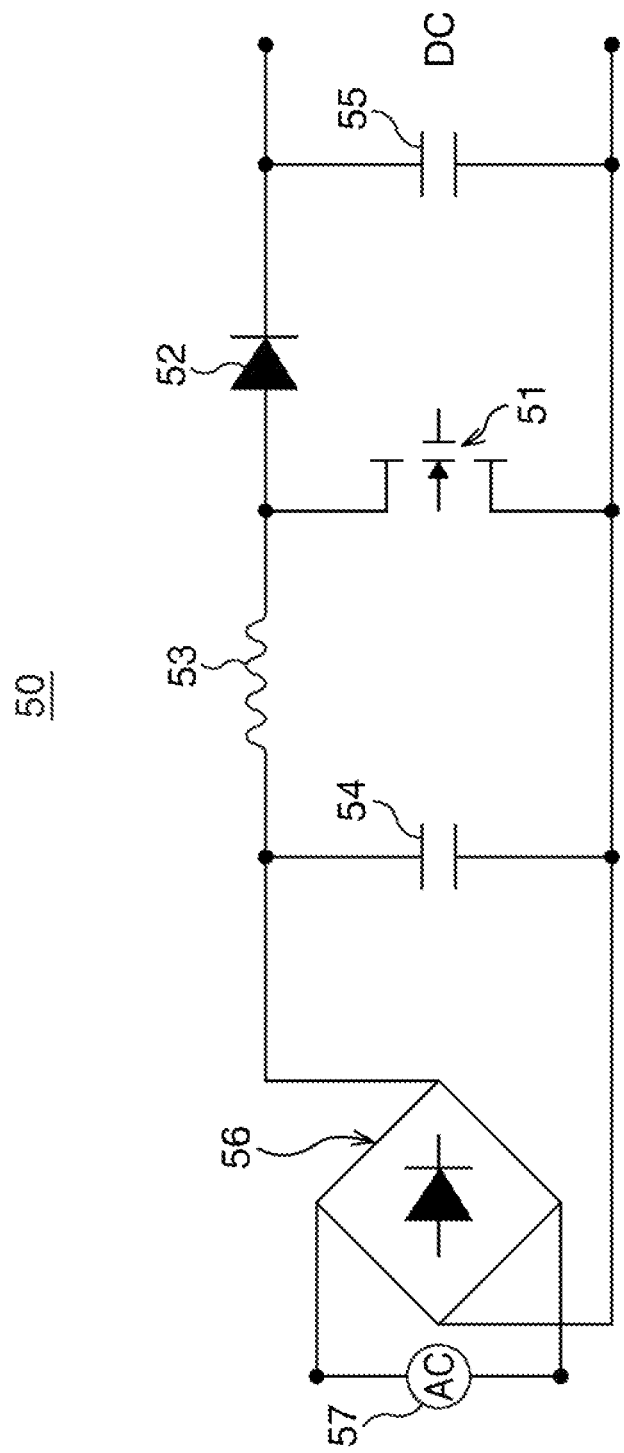
FIG. 19 is a connection wiring diagram illustrating a PFC circuit according to a third embodiment.

FIG. 19 is a connection wiring diagram illustrating the PFC circuit.

A PFC circuit 50 is provided with a switch element (transistor) 51, a diode 52, a choke coil 53, a capacitor 54, 55, a diode bridge 56, and an AC power supply (AC) 57. The AlGaN/GaN HEMT selected from those of the first and second embodiments and the modified examples thereof is applied to the switch element 51. An AlGaN/GaN HEMT according to any one of the second embodiment and the modified examples thereof superior in operating speed is particularly preferable.

In the PFC circuit 50, the drain electrode of the switch element 51, the anode terminal of the diode 52, and one terminal of the choke coil 53 are connect to one another. The source electrode of the switch element 51, one terminal of the capacitor 54, and one terminal of the capacitor 55 are connected to one another. The other terminal of the capacitor 54 and the other terminal of the choke coil 53 are connected to each other. The other terminal of the capacitor 55 and the cathode terminal of the diode 52 are connected to each other. The AC 57 is connected between the two terminals of the capacitor 54 through the diode bridge 56. A DC power source (DC) is connected between the two terminals of the capacitor 55.

In the present embodiment, an AlGaN/GaN HEMT capable of further improving the speed of device operation and achieving stable operation even if holes are produced, in addition to realizing a further improvement in voltage resistance is applied to the PFC circuit 50. Consequently, there is embodied a high-reliability PFC circuit 50.

Fourth Embodiment

The present embodiment discloses a power-supply unit provided with an AlGaN/GaN HEMT selected from those of the first embodiment and the modified examples thereof.

Figure 20:
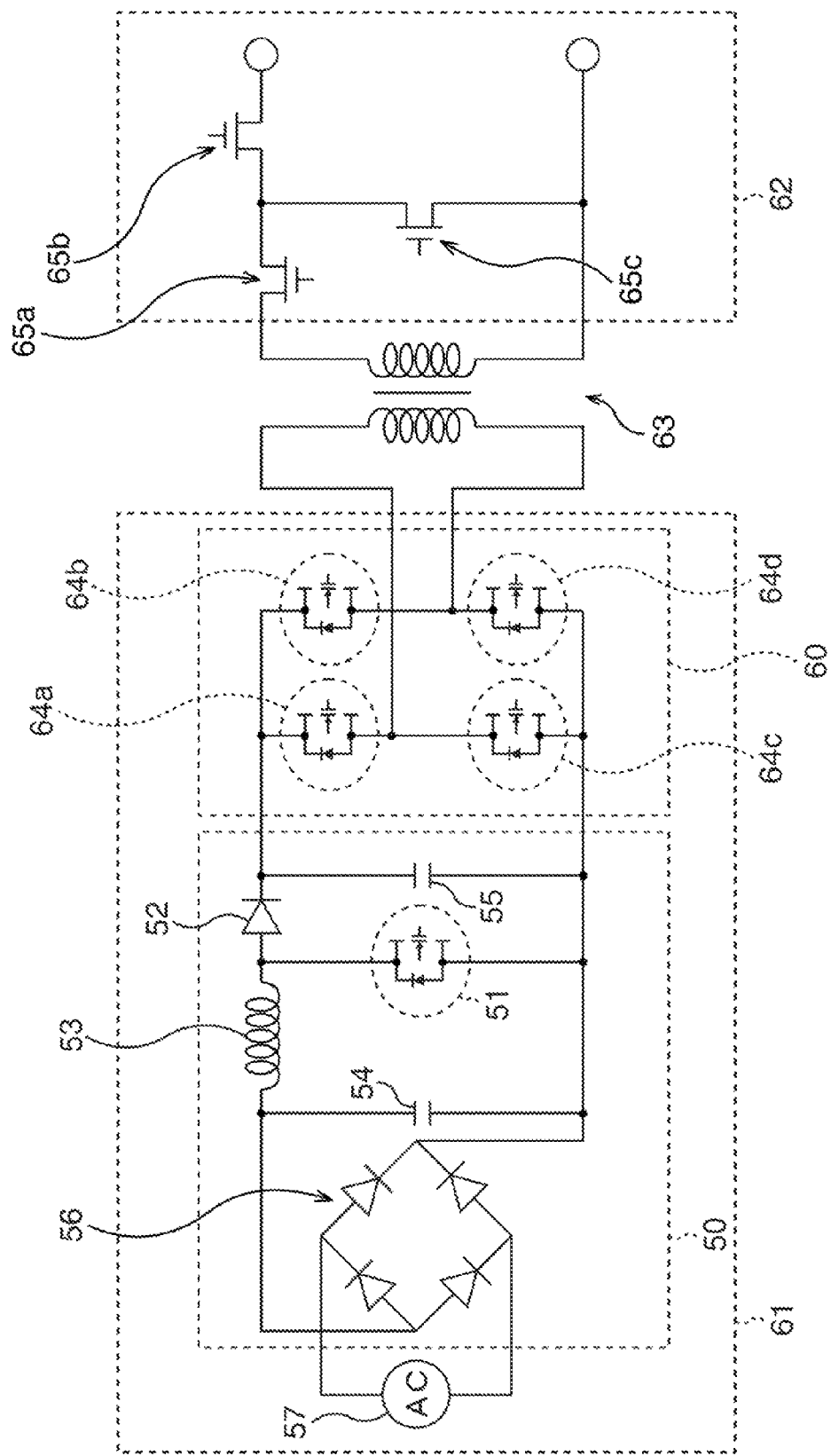
FIG. 20 is a connection wiring diagram illustrating a schematic configuration of a power-supply unit according to a fourth embodiment.

FIG. 20 is a connection wiring diagram illustrating a schematic configuration of a power-supply unit according to the third embodiment.

The power-supply unit according to the present embodiment is provided with a high-voltage circuit in the primary side 61, a low-voltage circuit in the secondary side 62, and a transformer 63 arranged between the circuit in the primary side 61 and the circuit in the secondary side 62.

The circuit in the primary side 61 includes a PFC circuit 50 according to the third embodiment, and an inverter circuit, for example, a full-bridge inverter circuit 60 connected between the two terminals of the capacitor 55 of the PFC circuit 50.

The full-bridge inverter circuit 60 is provided with a plurality of (four, here) switch elements 64a, 64b, 64c and 64d.

The circuit in the secondary side 62 is provided with a plurality of (three, here) switch elements 65a, 65b and 65c.

In the present embodiment, the switch element 51 of the PFC circuit 50 constituting the circuit in the primary side 61 and the switch elements 64a, 64b, 64c and 64d of the full-bridge inverter circuit 60 are specified as AlGaN/GaN HEMTs selected from those of the first embodiment and the modified examples thereof. On the other hand, the switch elements 65a, 65b and 65c of the circuit in the secondary side 62 are specified as regular MIS FETs using silicon.

An AlGaN/GaN HEMT selected from those of the first embodiment and the modified examples thereof adopts a field plate having direct contact with a structure of stacked compound semiconductors to make a pn junction therewith, as described in the first embodiment. Consequently, there is imparted the function of a protective diode in which the field plate serves as an anode and the drain electrode serves as a cathode. In the present embodiment, this AlGaN/GaN HEMT is applied to the switch element 51 of the PFC circuit 50 and the switch elements 64a, 64b, 64c and 64d of the full-bridge inverter circuit 60. Accordingly, even if surge voltages arise in the switch elements 51, 64a, 64b, 64c and 64d in the circuit in the primary side 61, the switch elements 51, 64a, 64b, 64c and 64d are prevented from breakdown by the commutating action of the protective diode. As described above, the present embodiment ensures a large amount of avalanche resistance and contributes to stabilizing device operation.

In the present embodiment, a high-reliability high-voltage resistance AlGaN/GaN HEMT capable of improving the speed of device operation, being high in avalanche resistance, being resistant to surges, eliminating the need to connect any external diodes when applied to, for example, an inverter circuit, and achieving stable operation even if holes are produced, in addition to realizing a further improvement in voltage resistance is applied to the circuit in the primary side 61 which is a high-voltage circuit. Consequently, there is embodied a high-reliability high-power power-supply unit.

Fifth Embodiment

The present embodiment discloses a high-frequency amplifier provided with an AlGaN/GaN HEMT selected from those of the first and second embodiments and the modified examples thereof.

FIG. 21 is a connection wiring diagram illustrating a schematic configuration of the high-frequency amplifier according to the fifth embodiment.

The high-frequency amplifier according to the present embodiment is provided with a digital predistortion circuit 71, mixers 72a and 72b, and a power amplifier 73.

The digital predistortion circuit 71 compensates for the nonlinear distortions of an input signal. The mixer 72a mixes the input signal compensated for nonlinear distortions and an AC signal. The power amplifier 73 amplifies the input signal mixed with the AC signal, and includes an AlGaN/GaN HEMT selected from those of the first and second embodiments and the modified examples thereof. An AlGaN/GaN HEMT according to any one of the second embodiment and the modified examples thereof superior in operating speed is particularly preferable. Note that in FIG. 21, the high-frequency circuit is configured to be able to mix an output-side signal with the AC signal by the mixer 72b and send out the mixed signal to the digital predistortion circuit 71 by means of, for example, switch operation.

In the present embodiment, an AlGaN/GaN HEMT capable of improving the speed of device operation and achieving stable operation even if holes are produced, in addition to realizing a further improvement in voltage resistance is applied to the high-frequency amplifier. Consequently, there is embodied a high-reliability high-voltage resistance high-frequency amplifier.

Other Embodiments

In the first and second embodiments, the modified examples thereof, and the third to fifth embodiments, an AlGaN/GaN HEMT has been cited by way of example as a compound semiconductor device. As compound semiconductor devices, the embodiments and the modified examples can also be applied to the below-described HEMTs, in addition to the AlGaN/GaN HEMT.

Example 1 of Other HEMTs

The present example discloses an InAlN/GaN HEMT as a compound semiconductor device.

InAlN and GaN are compound semiconductors the lattice constants of which can be approximated to each other by means of composition. In this case, an electron transit layer, an intermediate layer, an electron supply layer and a cap layer are formed of i-GaN, i-InAlN, n-InAlN and n-GaN, respectively, in the above-described first and second embodiments, modified examples thereof, and third to fifth embodiments. In addition, a two-dimensional electron gas is generated mainly by the spontaneous polarization of InAlN since piezoelectric polarization hardly occurs in this case.

According to the present example, there is embodied, like the above-described AlGaN/GaN HEMT, a high-reliability high-voltage resistance InAlN/GaN HEMT capable of improving the speed of device operation, being high in avalanche resistance, being resistant to surges, eliminating the need to connect any external diodes when applied to, for example, an inverter circuit, and achieving stable operation even if holes are produced, in addition to alleviating the concentration of electric fields on a gate electrode and thereby realizing a further improvement in voltage resistance.

Example 2 of Other HEMTs

The present example discloses an InAlGaN/GaN HEMT as a compound semiconductor device.

GaN and InAlGaN are compound semiconductors in which the lattice constant of GaN can be made smaller than that of InAlGaN by means of composition. In this case, an electron transit layer, an intermediate layer, an electron supply layer and a cap layer are formed of i-GaN, i-InAlGaN, n-InAlGaN and n-GaN, respectively, in the above-described first and second embodiments, modified examples thereof, and third to fifth embodiments.

According to the present example, there is embodied, like the above-described AlGaN/GaN HEMT, a high-reliability, high-voltage resistance InAlGaN/GaN HEMT capable of improving the speed of device operation, being high in avalanche resistance, being resistant to surges, eliminating the need to connect any external diodes when applied to, for example, an inverter circuit, and achieving stable operation even if holes are produced, in addition to alleviating the concentration of electric fields on a gate electrode and thereby realizing a further improvement in voltage resistance.

According to the above-described aspects, there is embodied a high-reliability high-voltage resistance compound semiconductor device capable of improving the speed of device operation, being high in avalanche resistance, being resistant to surges, eliminating the need to connect any external diodes when applied to, for example, an inverter circuit, and achieving secure and stable operation even if holes are produced, in addition to alleviating the concentration of electric fields on a gate electrode and thereby realizing a further improvement in voltage resistance.

Hereinafter, compound semiconductor devices, methods for manufacturing the compound semiconductor devices, and aspects of power-supply units and high-frequency amplifiers will be collectively described as claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A compound semiconductor device, comprising:
a structure of stacked compound semiconductors;
a gate electrode formed above the structure of stacked compound semiconductors;
a source electrode and a drain electrode which are formed above the structure of stacked compound semiconductors; and
a semiconductor layer formed above the structure of stacked compound semiconductors and having a conductivity type opposite to a conductivity type that the structure of stacked compound semiconductors has,
wherein the gate electrode and the semiconductor layer stand apart each other above the structure of stacked compound semiconductors in planar view, and
wherein the semiconductor layer is of a p type and a connecting electrode is formed on the semiconductor layer.

2. The compound semiconductor device according to claim 1, wherein a recess is formed in the structure of stacked compound semiconductors and the semiconductor layer is formed so as to fill the interior of the recess.

3. The compound semiconductor device according to claim 1, wherein the semiconductor layer is formed with an insulation film interposed between the semiconductor layer and the structure of stacked compound semiconductors.

4. The compound semiconductor device according to claim 1, wherein the semiconductor layer makes a pn junction with the structure of stacked compound semiconductors.

5. The compound semiconductor device according to claim 1, wherein the semiconductor layer is formed into a shape biased in a direction not facing the gate electrode.

6. The compound semiconductor device according to claim 1, wherein the semiconductor layer is of a p type and composed of one or a plurality of semiconductors selected from the group consisting of Si, GaN, AlGaN, AlN, InN, InAlN, InAlGaN, NiO, FeO2, CoO2, MnO, CuO, ZnO, In2O3, SnO2, Y2O3, SrTiO3, SrPbO3 and TiO2.

7. A method for manufacturing a compound semiconductor device, the method comprising:
forming a gate electrode above a structure of stacked compound semiconductors;
forming a source electrode and a drain electrode above the structure of stacked compound semiconductors; and
forming a semiconductor layer having a conductivity type opposite to a conductivity type that the structure of stacked compound semiconductors has above the structure of stacked compound semiconductors,
wherein the gate electrode and the semiconductor layer stand apart each other above the structure of stacked compound semiconductors in planar view, and
wherein the semiconductor layer is of a p type and a connecting electrode is formed on the semiconductor layer.

8. The method for manufacturing a compound semiconductor device according to claim 7, the method further comprising forming a recess in the structure of stacked compound semiconductors, wherein the semiconductor layer is formed so as to fill the interior of the recess.

9. The method for manufacturing a compound semiconductor device according to claim 7, the method further comprising forming an insulation film on the structure of stacked compound semiconductors, wherein the semiconductor layer is formed with the insulation film interposed between the semiconductor layer and the structure of stacked compound semiconductors.

10. The method for manufacturing a compound semiconductor device according to claim 7, wherein the semiconductor layer makes a pn junction with the structure of stacked compound semiconductors.

11. The method for manufacturing a compound semiconductor device according to claim 7, wherein the semiconductor layer is formed into a shape biased in a direction not facing the gate electrode.

12. The method for manufacturing a compound semiconductor device according to claim 7, wherein the semiconductor layer is of a p type and composed of one or a plurality of semiconductors selected from the group consisting of Si, GaN, AlGaN, AlN, InN, InAlN, InAlGaN, NiO, FeO2, CoO2, MnO, CuO, ZnO, In2O3, SnO2, Y2O3, SrTiO3, SrPbO3 and TiO2.

13. A power-supply unit comprising a transformer, and a high-voltage circuit and a low-voltage circuit with the transformer therebetween, wherein the high-voltage circuit includes a transistor, the transistor comprising:
a structure of stacked compound semiconductors;
a gate electrode formed above the structure of stacked compound semiconductors; and
a semiconductor layer formed above the structure of stacked compound semiconductors and having a conductivity type opposite to a conductivity type that the structure of stacked compound semiconductors has.

14. The power-supply unit according to claim 13, wherein the high-voltage circuit comprises a PFC circuit and a first switch element provided in the PFC circuit is defined as the transistor.

15. The power-supply unit according to claim 14, wherein the high-voltage circuit further comprises an inverter circuit connected to the PFC circuit, and a second switch element provided in the inverter circuit is defined as the transistor.

16. A high-frequency amplifier amplifying and outputting an input high-frequency voltage, wherein the high-frequency amplifier includes a transistor, the transistor comprising:
a structure of stacked compound semiconductors;
a gate electrode formed above the structure of stacked compound semiconductors; and
a semiconductor layer formed above the structure of stacked compound semiconductors and having a conductivity type opposite to a conductivity type that the structure of stacked compound semiconductors has.

* * * * *